(12) United States Patent
Toyomura et al.

(10) Patent No.: US 9,466,250 B2
(45) Date of Patent: Oct. 11, 2016

(54) DISPLAY DEVICE AND ELECTRONIC APPARATUS, AND DRIVING METHOD OF DISPLAY PANEL

(71) Applicant: JOLED Inc., Tokyo (JP)

(72) Inventors: Naobumi Toyomura, Kanagawa (JP); Junichi Yamashita, Tokyo (JP)

(73) Assignee: JOLED Inc., Tokyo (JP)

( * ) Notice: Subject to any disclaimer, the term of this patent is extended or adjusted under 35 U.S.C. 154(b) by 337 days.

(21) Appl. No.: 13/938,319

(22) Filed: Jul. 10, 2013

(65) Prior Publication Data

US 2014/0035895 A1 Feb. 6, 2014

(30) Foreign Application Priority Data

Jul. 31, 2012 (JP) .................................. 2012-170306

(51) Int. Cl.
  *G09G 3/36* (2006.01)
  *G09G 3/32* (2016.01)
  *H01L 27/32* (2006.01)

(52) U.S. Cl.
  CPC ........... *G09G 3/3611* (2013.01); *G09G 3/3225* (2013.01); *H01L 27/3276* (2013.01); *G09G 2320/045* (2013.01)

(58) Field of Classification Search
  CPC ............. G09G 3/3266; G09G 3/3611; G09G 3/3225; H01L 27/3276
  See application file for complete search history.

(56) References Cited

U.S. PATENT DOCUMENTS

| | | | |
|---|---|---|---|
| 6,559,433 B1* | 5/2003 | Ozawa | G06F 3/0412 250/208.1 |
| 6,771,028 B1* | 8/2004 | Winters | G09G 3/3233 315/169.1 |
| 7,173,279 B2* | 2/2007 | Yamazaki | G09G 3/3233 257/59 |
| 2001/0028060 A1* | 10/2001 | Yamazaki | G09G 3/3233 257/72 |
| 2009/0179888 A1* | 7/2009 | Yamashita | G09G 3/3233 345/212 |
| 2010/0244029 A1* | 9/2010 | Yamazaki | H01L 27/1225 257/52 |

FOREIGN PATENT DOCUMENTS

JP 2008-083272 4/2008

\* cited by examiner

*Primary Examiner* — Quan-Zhen Wang
*Assistant Examiner* — Xuemei Zheng
(74) *Attorney, Agent, or Firm* — Michael Best & Friedrich LLP

(57) ABSTRACT

A color display unit includes subpixels arranged in matrix form. Display pixels are formed from multiple subpixels, one for each of the display colors, grouped together across multiple subpixel rows. Drive units are formed including multiple rows of display pixels that are connected to a common power supply line. Common write scanning lines are provided, where the number of common write scanning lines per drive unit equals the number of rows of subpixels that are included in a display pixel. Each common write scanning line is connected to every pixel of at least one given color in its respective drive unit. The drive units are driven sequentially in a drive-unit-scanning direction. Within each individual drive unit, the write scanning lines thereof are scanned for the signal writing operation sequentially in a scanning direction opposite to the drive-unit-scanning direction.

20 Claims, 20 Drawing Sheets

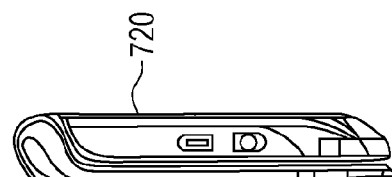
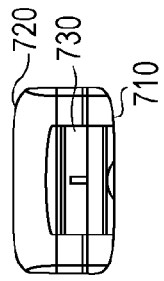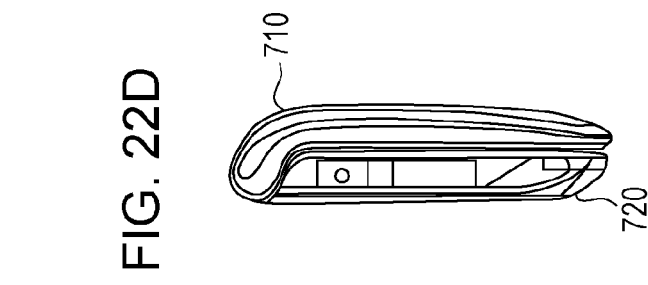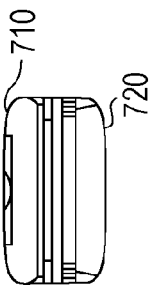
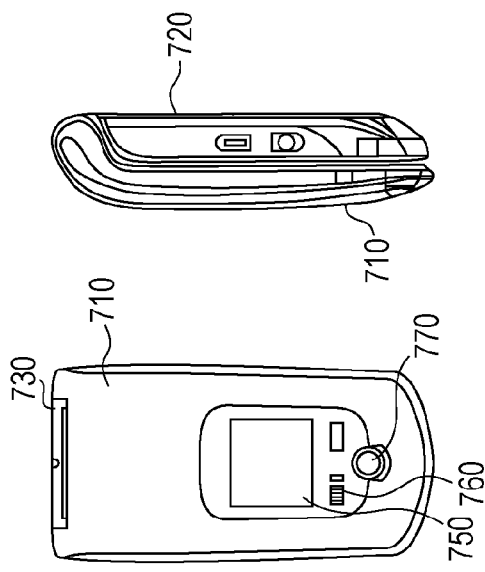
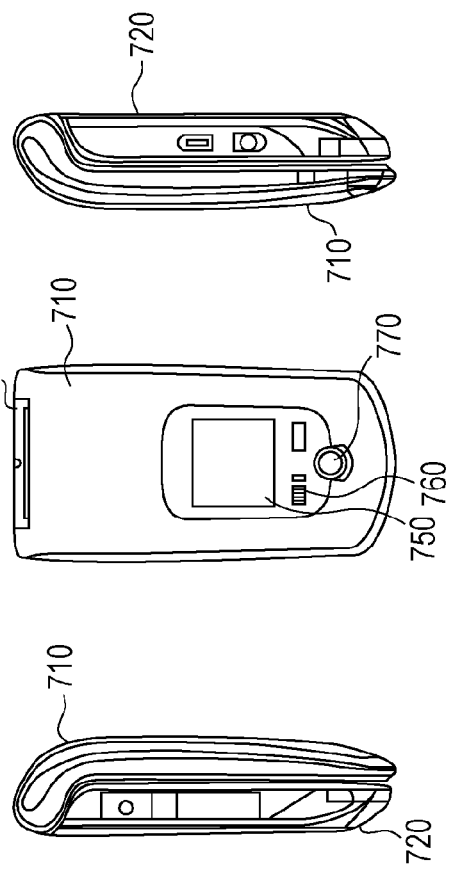
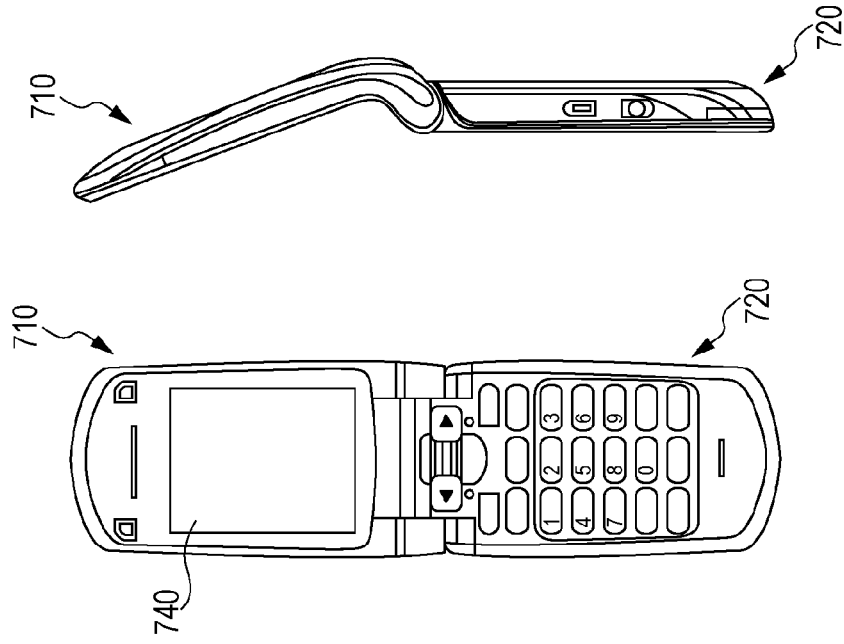

US 9,466,250 B2

DISPLAY DEVICE AND ELECTRONIC APPARATUS, AND DRIVING METHOD OF DISPLAY PANEL

BACKGROUND

The present disclosure relates to a display device and an electronic apparatus that include a display panel having light emitting elements, for example, organic EL (Electro Luminescence) elements in each pixel, and a driving method of such a display panel.

In recent years, in the field of display devices that displays images, a display device that uses, as light emitting elements of pixels, current driving type light emitting elements, for example, organic EL elements of which luminance of emitted light changes according to values of running currents has been developed, and commercialized. Such an organic EL element is a self-luminous element different from a crystal liquid element. For this reason, a light source (backlight) is not necessary for a display device that uses organic EL elements (organic EL display device), and thus, the device can be further thinned and exhibit higher luminance in comparison to a crystal liquid display device that has a light source.

Meanwhile a current-voltage (I-V) characteristic of an organic EL element deteriorates as time elapses (time degradation) in general. When the I-V characteristic of an organic EL element changes according to time in a pixel circuit that drives a current of the organic EL element, a voltage dividing ratio between the organic EL element and a drive transistor connected to the organic EL element in series changes, and thus, a voltage between gate sources of the drive transistor also changes. As a result, since the value of a current flowing in the drive transistor changes, the value of a current flowing in the organic EL element also changes, and accordingly, luminance of emitted light also changes according to the value of the current.

In addition, there are cases in which a threshold voltage (Vth) and the degree of movement ($\mu$) of a drive transistor change as time elapses, or Vth and $\mu$ show different values according to pixel circuits due to unevenness in a manufacturing process. When Vth and $\mu$ of a drive transistor show different values according to pixel circuits, the value of a current flowing in the drive transistor are uneven according to pixel circuits, and thus, even if the same voltage is applied to gates of the drive transistor, luminance of emitted light of an organic EL element is uneven, and accordingly, evenness (uniformity) of a screen is flawed.

Therefore, even when the I-V characteristic of an organic EL element changes as time elapses, or Vth and $\mu$ of a drive transistor change as time elapses, in order to constantly maintain luminance of emitted light of an organic EL element without being affected by such changes, a display device into which a compensating function for a variation in the I-V characteristic of an organic EL element and a correcting function for a variation in Vth and $\mu$ of a drive transistor are incorporated has been developed (for example, Japanese Unexamined Patent Application Publication No. 2008-083272).

SUMMARY

Meanwhile, for the purpose of interpolating holding capacitors that hold voltages between gate sources of a drive transistor, an auxiliary capacitor is connected to a source of the drive transistor. In this case, there is a case in which a wiring having a constant voltage (constant voltage line) connected to one end of the auxiliary capacitor is shared with other pixels. In such a case, however, when a pixel out of a plurality of pixels sharing the constant-voltage line with each other is driven, the influence of the drive spreads to another pixel via the constant voltage line, and the voltage of the sources of the drive transistor in the pixel thereby fluctuates. As a result, the voltage of gates of the drive transistor in the pixel fluctuates according to the fluctuation of the voltage of the sources.

While coupling between a plurality of pixels occurs in this manner, the fluctuation of the voltage of gates changes according to the fluctuation of the voltage of sources in pixels that are affected by the coupling. When coupling occurs after a variation in $\mu$ of a drive transistor is corrected, the voltage between gate sources of the drive transistor changes little from the value before the coupling. However, when coupling occurs before a variation in $\mu$ of a drive transistor is corrected, the voltage between gate sources of the drive transistor becomes smaller than that before coupling, and luminance of emitted light thereby becomes lower. As a result, when pixels in which the voltage between gate sources of a drive transistor changes little from the value thereof before coupling and pixels in which the voltage between gate sources of a drive transistor becomes lower than the value thereof before coupling are mixed, there is a problem in that a difference is made in the tendency of a change in luminance of emitted light, thereby causing luminance unevenness.

It is desirable for the present technology to provide a display device and an electronic apparatus that can reduce luminance unevenness caused by coupling and a driving method of a display panel that can reduce luminance unevenness caused by coupling.

According to an aspect of an exemplary illustration of the subject matter of the disclosure, a display unit may include: a plurality of pixel circuits disposed in a matrix form comprising rows and columns, each of the plurality of pixel circuits including a display element, a first transistor, a capacitor, and a second transistor; a plurality of write scanning lines, each connected to a respectively corresponding row of the plurality of pixel circuits; a plurality of signal lines, each connected to a respectively corresponding column of the plurality of pixel circuits; a plurality of power supply lines, each connected to two respectively corresponding adjacent rows of the plurality of pixel circuits; and a drive control section. The plurality of pixel circuits may be grouped into drive units each comprising K≥4 contiguous rows of pixel circuits that are connected to a corresponding unit power supply line, which is made up of K/2 of the plurality of power supply lines configured as a common line. Each of the drive units may include L≥2 unit write scanning lines that each comprise M≥2 of the plurality of write scanning lines configured as a common line, where K=L·M. The drive control section may be configured to cause a write scanning pulse for a signal writing operation to be sequentially applied to the unit write scanning lines of a given one of the drive units in an order that progresses in a different direction from a direction in which an order of driving the drive units to emit light progresses.

Further, in the above-described exemplary illustration, each of the plurality of pixel circuits may correspond to one of N display colors and the plurality of pixel circuits may be grouped into display pixel units each comprising N of the plurality of pixel circuits corresponding respectively to the N display colors, which are contiguously disposed in M≤N contiguous rows.

Further, in the above-described exemplary illustration, each unit write scanning line may correspond to at least one of the display colors and is connected to all of the pixel circuits that correspond to any of the display colors to which the respective unit write scanning line corresponds and that are included in the drive unit to which the respective unit write scanning line belongs.

Further, in the above-described exemplary illustration, for each of the plurality of pixel circuits: the first transistor may be configured to sample a potential carried on one of the plurality of signal lines when a scanning pulse is applied to one of the plurality of write scanning lines, which is connected to the first transistor, the capacitor with a first terminal may be to hold the potential sampled by the first transistor, and the second transistor may be configured to supply a drive current to the display element, the magnitude of the drive current corresponding to a voltage between the first terminal of the capacitor and a second terminal of the capacitor.

Further, in the above-described exemplary illustration, the drive units may be driven unit-sequentially in an order that progresses from a first drive unit closest to a first side of the display unit to a last drive unit closest to a second side of the display unit opposite the first side, and the write scanning pulse may be applied to the unit write scanning lines of the given one of the drive units sequentially in an order that progresses from a last unit write scanning line of the given one of the drive units to a first unit write scanning line of the given one of the drive units, the last unit write scanning line of the given one of the drive units including the one of the plurality of write scanning lines of the given one of the drive units that is closest to the second side of the display unit and the first unit write scanning line of the given one of the drive units including the one of the plurality of write scanning lines of the given one of the drive units that is closest to the first side of the display unit.

Further, in the above-described exemplary illustration, the drive control section may be configured to cause the plurality of pixel circuits to display image frames corresponding to input image data by control driving of the plurality of write scanning lines, the plurality of signal lines, and the plurality of power supply lines, the plurality of pixel circuits may be configured to perform, under control of the drive control section, a threshold correction operation that results in storing a threshold voltage of the second transistor of the respective one of the plurality of pixel circuit in the capacitor of the respective one of the plurality of pixel circuit. The drive control section may also be configured to cause each of the plurality of pixel circuits included in the given one of the drive units to perform the threshold correction operation simultaneously during a given image frame period.

Further, in the above-described exemplary illustration, the drive control section may configured to cause each of the plurality of pixel circuits included in the given one of the drive units to perform the threshold correction operation by causing the first transistor of the respective pixel circuit to be in a conductive state while a reference potential is carried on the signal line connected to the respective pixel circuit and while a drive voltage is applied to the second transistor of the respective pixel circuit.

Further, in the above-described exemplary illustration, for a given one of the plurality of pixel circuits, the signal writing operation may include causing the given one of the plurality of pixel circuits to sample a video signal potential by placing the first transistor of the given one of the plurality of pixel circuits in a conductive state while a video signal potential is applied to the signal line connected to the given one of the plurality of pixel circuits.

Further, in the above-described exemplary illustration, N may equal 4, M may equal 2, K may equal 8, and the display colors may comprise red, green, and blue.

Further, in the above-described exemplary illustration, the display colors may further comprise white.

Further, in the above-described exemplary illustration, the display colors may further comprise yellow.

According to an aspect of a second exemplary illustration of the subject matter of the disclosure, a display unit may comprise: a plurality of pixel circuits disposed in a matrix form comprising rows and columns, each of the plurality of pixel circuits including a display element, a first transistor, a capacitor, and a second transistor; a plurality of write scanning lines, each connected to a respectively corresponding row of the plurality of pixel circuits; a plurality of signal lines, each connected to a respectively corresponding column of the plurality of pixel circuits; a plurality of power supply lines, each connected to two respectively corresponding adjacent rows of the plurality of pixel circuits; and a drive control section. The plurality of pixel circuits may be grouped into drive units each comprising four contiguous rows of pixel circuits that are connected to a corresponding unit power supply line, which is made up of two of the plurality of power supply lines configured as a common line. Each of the drive units may include two unit write scanning lines that each comprise two of the plurality of write scanning lines configured as a common line, and the drive control section is configured to cause a write scanning pulse for a signal writing operation to be sequentially applied to the unit write scanning lines of a given one of the drive units in an order that progresses in a different direction from a direction in which an order of driving the drive units to emit light progresses.

Further, in the above-described exemplary illustration, each of the plurality of pixel circuits may correspond to one of four display colors and the plurality of pixel circuits are grouped into display pixel units each comprising four of the plurality of pixel circuits contiguously disposed in two adjacent rows and corresponding respectively to the four display colors.

Further, in the above-described exemplary illustration, each unit write scanning line may correspond to two of the display colors and is connected to all of the pixel circuits that correspond to any of the display colors to which the respective unit write scanning line corresponds and that are included in the drive unit to which the respective unit write scanning line belongs.

Further, in the above-described exemplary illustration, for each of the plurality of pixel circuits: the first transistor may be configured to sample a potential carried on one of the plurality of signal lines when a scanning pulse is applied to one of the plurality of write scanning lines, which is connected to the first transistor, the capacitor with a first terminal may be configured to hold the potential sampled by the first transistor, and the second transistor may be configured to supply a drive current to the display element, the magnitude of the drive current corresponding to a voltage between the first terminal of the capacitor and a second terminal of the capacitor.

Further, in the above-described exemplary illustration, the drive units may be driven unit-sequentially in an order that progresses from a first drive unit closest to a first side of the display unit to a last drive unit closest to a second side of the display unit opposite the first side, and the write scanning pulse may be applied to the unit write scanning lines of the given one of the drive units sequentially in an order that progresses from a last unit write scanning line of the given one of the drive units to a first unit write scanning line of the given one of the drive units, the last unit write scanning line of the given one of the drive units including the one of the plurality of write scanning lines of the given one of the drive units that is closest to the second side of the display unit and the first unit write scanning line of the given one of the drive units including the one of the plurality of write scanning lines of the given one of the drive units that is closest to the first side of the display unit.

Further, in the above-described exemplary illustration, the drive control section may be configured to cause the plurality of pixel circuits to display image frames corresponding to input image data by control driving of the plurality of write scanning lines, the plurality of signal lines, and the plurality of power supply lines, the plurality of pixel circuits may be configured to perform, under control of the drive control section, a threshold correction operation that results in storing a threshold voltage of the second transistor of the respective one of the plurality of pixel circuit in the capacitor of the respective one of the plurality of pixel circuit, and the drive control section may be configured to cause each of the plurality of pixel circuits included in the given one of the drive units to perform the threshold correction operation simultaneously during a given image frame period.

Further, in the above-described exemplary illustration, drive control section may be configured to cause each of the plurality of pixel circuits included in the given one of the drive units to perform the threshold correction operation by causing the first transistor of the respective pixel circuit to be in a conductive state while a reference potential is carried on the signal line connected to the respective pixel circuit and while a drive voltage is applied to the second transistor of the respective pixel circuit.

Further, in the above-described exemplary illustration, for a given one of the plurality of pixel circuits, the signal writing operation may comprise causing the given one of the plurality of pixel circuits to sample a video signal potential by placing the first transistor of the given one of the plurality of pixel circuits in a conductive state while a video signal potential is applied to the signal line connected to the given one of the plurality of pixel circuits.

According to an aspect of a third exemplary illustration of the subject matter, a method of driving a display unit may comprise: causing drive units to sequentially emit light in an order that progresses in a given direction; and causing a write scanning pulse for a signal writing operation to be sequentially applied to unit write scanning lines of a given one of the drive units in an order that progresses in a direction different from the given direction. The display unit may comprise: a plurality of pixel circuits disposed in a matrix form comprising rows and columns and each including a display element, a first transistor, a capacitor, and a second transistor; a plurality of write scanning lines, each connected to a respectively corresponding row of the plurality of pixel circuits; a plurality of signal lines, each connected to a respectively corresponding column of the plurality of pixel circuits; and a plurality of power supply lines, each connected to two respectively corresponding adjacent rows of the plurality of pixel circuits. The drive units each may comprise K≥4 contiguous rows of pixel circuits that are connected to a same unit power supply line, which is made up of K/2 of the plurality of power supply lines configured as a common line. Each of the drive units may include L≥2 unit write scanning lines that each comprise M≥2 of the plurality of write scanning lines configured as a common line, where K=L·M.

BRIEF DESCRIPTION OF THE DRAWINGS

FIG. 22A is a front view of Application Example 5 being in an open state;

FIG. 22B is a side view of Application Example 5;

FIG. 22C is a front view of Application Example 5 being in a closed state;

FIG. 22D is a left-side view of Application Example 5;

FIG. 22E is a right-side view of Application Example 5;

FIG. 22F is a top view of Application Example 5; and

FIG. 22G is a bottom view of Application Example 5.

DETAILED DESCRIPTION OF EMBODIMENTS

Hereinafter, embodiments for implementing the present technology will be described in detail with reference to the drawings. It should be noted that the descriptions will be provided in the following order.

1. Embodiment (Display device)
2. Modified example (Display device)
3. Application example (Electronic apparatus)

1. Embodiment

Configuration

Figure 1:
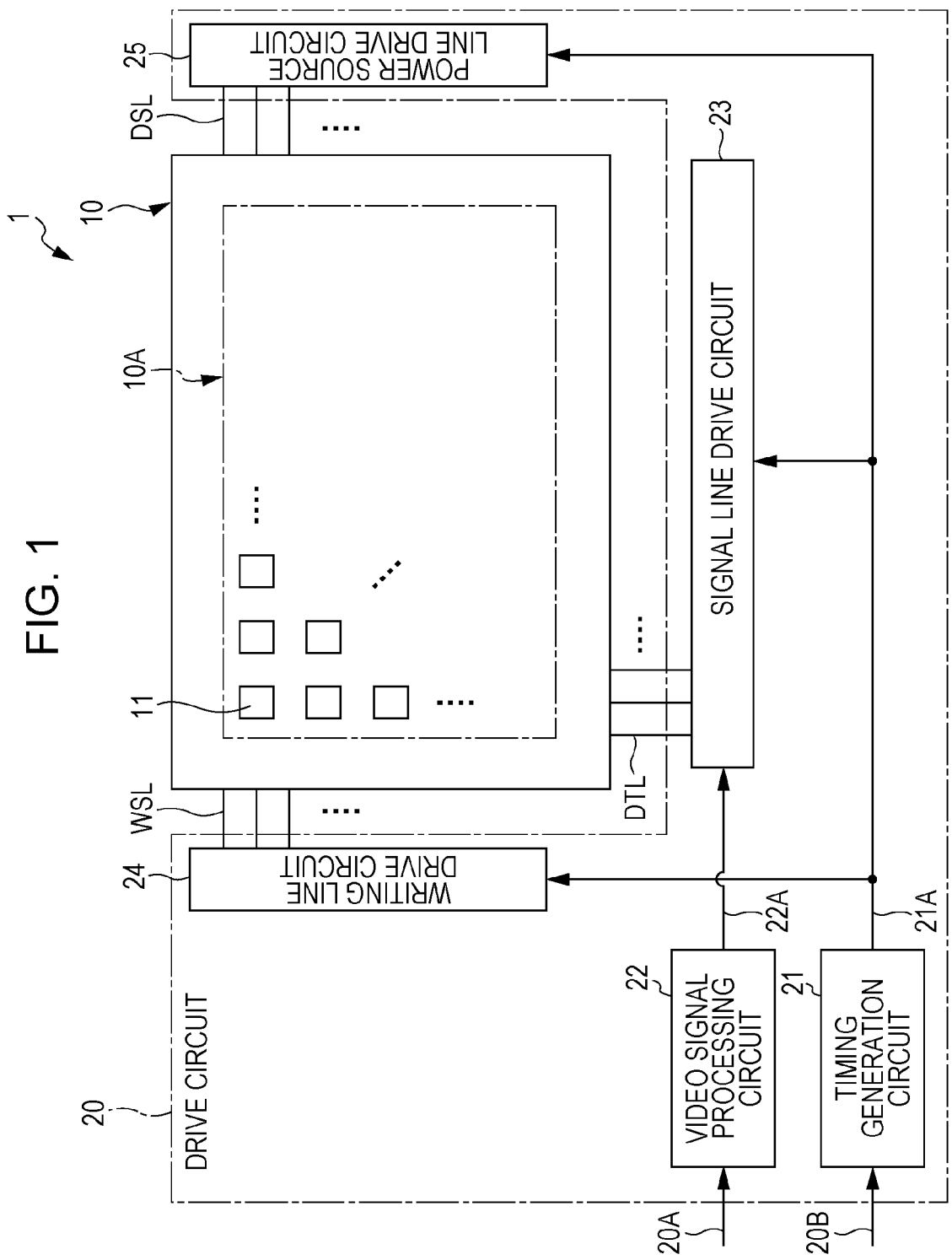
FIG. 1 is a schematic configuration diagram of a display device according to an embodiment of the present disclosure.

FIG. 1 shows a schematic configuration of a display device 1 according to an embodiment of the present technology. This display device 1 includes a display panel 10, and a drive circuit 20 that drives the display panel 10 based on a video signal 20A and a synchronization signal 20B input from outside. The drive circuit 20 has, for example, a timing generation circuit 21, a video signal processing circuit 22, a signal line drive circuit 23, a scanning line drive circuit 24, and a power source line drive circuit 25.

Display Panel 10

The display panel 10 has a plurality of pixels 11 disposed in a matrix shape over the entire face of a display region 10A of the display panel 10. The display panel 10 displays images based on the video signal 20A input from outside by performing active matrix driving on each of the pixels 11 with the drive circuit 20.

Figure 2:
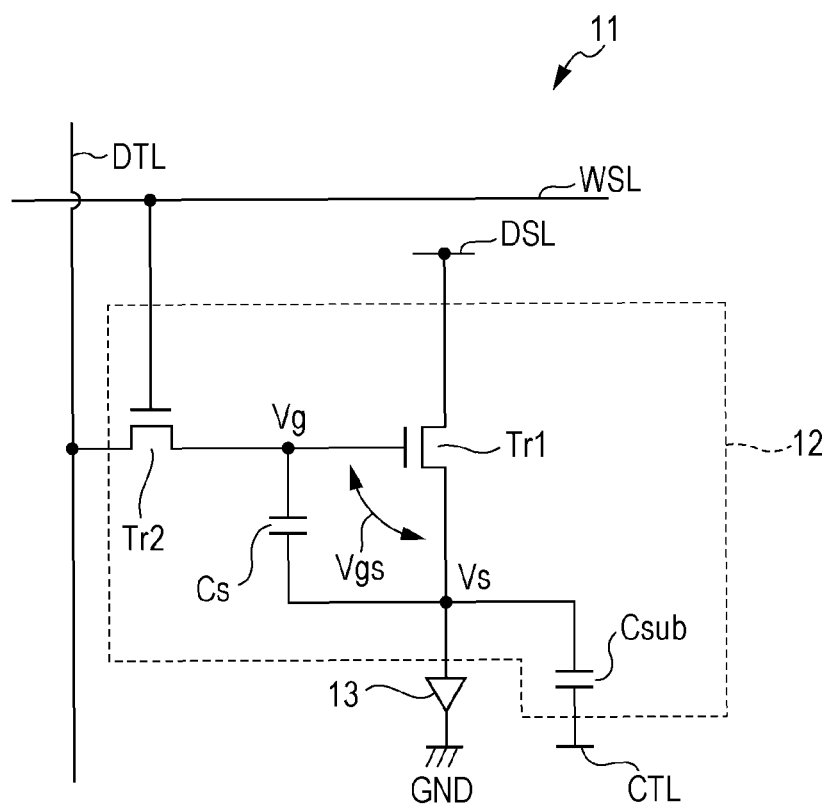
FIG. 2 is a diagram showing an example of a circuit configuration of each pixel (sub pixel)

FIG. 2 shows an example of a circuit configuration of the pixel 11. Each pixel 11 has, for example a pixel circuit 12, and an organic EL element 13. The organic EL element 13 is configured such that, for example, an anode electrode, an organic layer, and a cathode electrode are laminated in order. The organic EL element 13 has an element capacitor Coled (not shown). The pixel circuit 12 is constituted by, for example, a drive transistor Tr1, a writing transistor Tr2, and a holding capacitor Cs and an auxiliary capacitor Csub, and is configured as a circuit of 2Tr2C.

The writing transistor Tr2 controls application of a signal voltage to a gate of the drive transistor Tr1 corresponding to a video signal. To be specific, the writing transistor Tr2 performs sampling of a voltage of a signal line DTL to be described later, and writing on the gate of the drive transistor Tr1. The drive transistor Tr1 drives the organic EL element 13, and connected thereto in series. The drive transistor Tr1 controls a current flowing in the organic EL element 13 according to the intensity of a voltage written by the writing transistor Tr2. The holding capacitor Cs holds a predetermined voltage between gate sources of the drive transistor Tr1. The auxiliary capacitor Csub causes some of currents supplied from the drive transistor Tr1 to flow in. It should be noted that the pixel circuit 12 may be configured such that various capacitors and transistors are added to the circuit of 2Tr2C described above or may be configured as a circuit different from the circuit configuration of 2Tr2C described above.

The drive transistor Tr1 and the writing transistor Tr2 are formed of, for example, an n-channel MOS type thin-film transistor (TFT (Thin-Film Transistor)). It should be noted that the type of a TFT is not particularly limited, and may be, for example, an inverse stagger structure (so-called bottom gate type), or may be a stagger structure (top gate type). In addition, the drive transistor Tr1 and the writing transistor Tr2 may be formed of a p-channel MOS type TFT.

The display panel 10 has a plurality of scanning lines WSL extending in a row direction, a plurality of signal lines DTL extending in a column direction, a plurality of power source line DSL extending in the row direction, and a plurality of cathode lines CTL (reference voltage line) extending in the row direction. The scanning lines WSL are used in selecting each of the pixels 11. The signal lines DTL are used in supplying signal voltages to each of the pixels 11 according to video signals. The power source lines DSL are used in supplying driving currents to each of the pixels 11.

The pixels 11 are provided near the intersections of each of the signal lines DTL and each of the scanning lines WSL. Each of the signal lines DTL is connected to an output end (not shown) of the signal line drive circuit 23, to be described later, and a source or a drain of the writing transistor Tr2. Each of the scanning lines WSL is connected to an output end (not shown) of the scanning line drive circuit 24, to be described later, and a gate of the writing transistor Tr2. Each of the power source lines DSL is connected to an output end (not shown) of the power source outputting a fixed voltage, and a source or a drain of the drive transistor Tr1. The cathode lines CTL are members, for example, provided around the display region 10A, and connected to a member that has a reference voltage.

The gate of the writing transistors Tr2 is connected to a scanning line WSL. The source or drain of the writing transistor Tr2 is connected to a signal line DTL, and the terminal of a source or a drain of the writing transistor Tr2 which is not connected to the signal lines DTL is connected to the gate of drive transistors Tr1. The source or drain of the drive transistor Tr1 is connected to a power source line DSL, and the terminal of a source or a drain of the drive transistor Tr1 which is not connected to the power source line DSL is connected to the anode of the organic EL element 13. One end of the holding capacitor Cs is connected to the gate of the drive transistor Tr1, and the other end of the holding capacitor Cs is connected to the source (the terminal on the organic EL element 13 side in FIG. 2) of the drive transistor Tr1. In other words, the holding capacitor Cs is inserted between gate sources of the drive transistor Tr1. One end of the auxiliary capacitor Csub is connected to the source (the terminal on the organic EL element 13 side in FIG. 2) of the drive transistor Tr1, and the other end of the auxiliary capacitor Csub is connected to a cathode line CTL.

The display panel 10 further has a ground line GND connected to the cathode of the organic EL element 13 as shown in FIG. 2. The ground line GND is electrically connected to an external circuit (not shown) that has a ground potential. The ground line GND is, for example, a sheet-like electrode formed over the entire display region 10A. It should be noted that the ground line GND may be a stripe-like electrode formed in a reed shape corresponding to pixel rows or pixel columns. The display panel 10 further has, for example, a frame region in the margin of the display region 10A, in which videos are not displayed. The frame region is covered by, for example, a light-blocking member.

Figure 3:
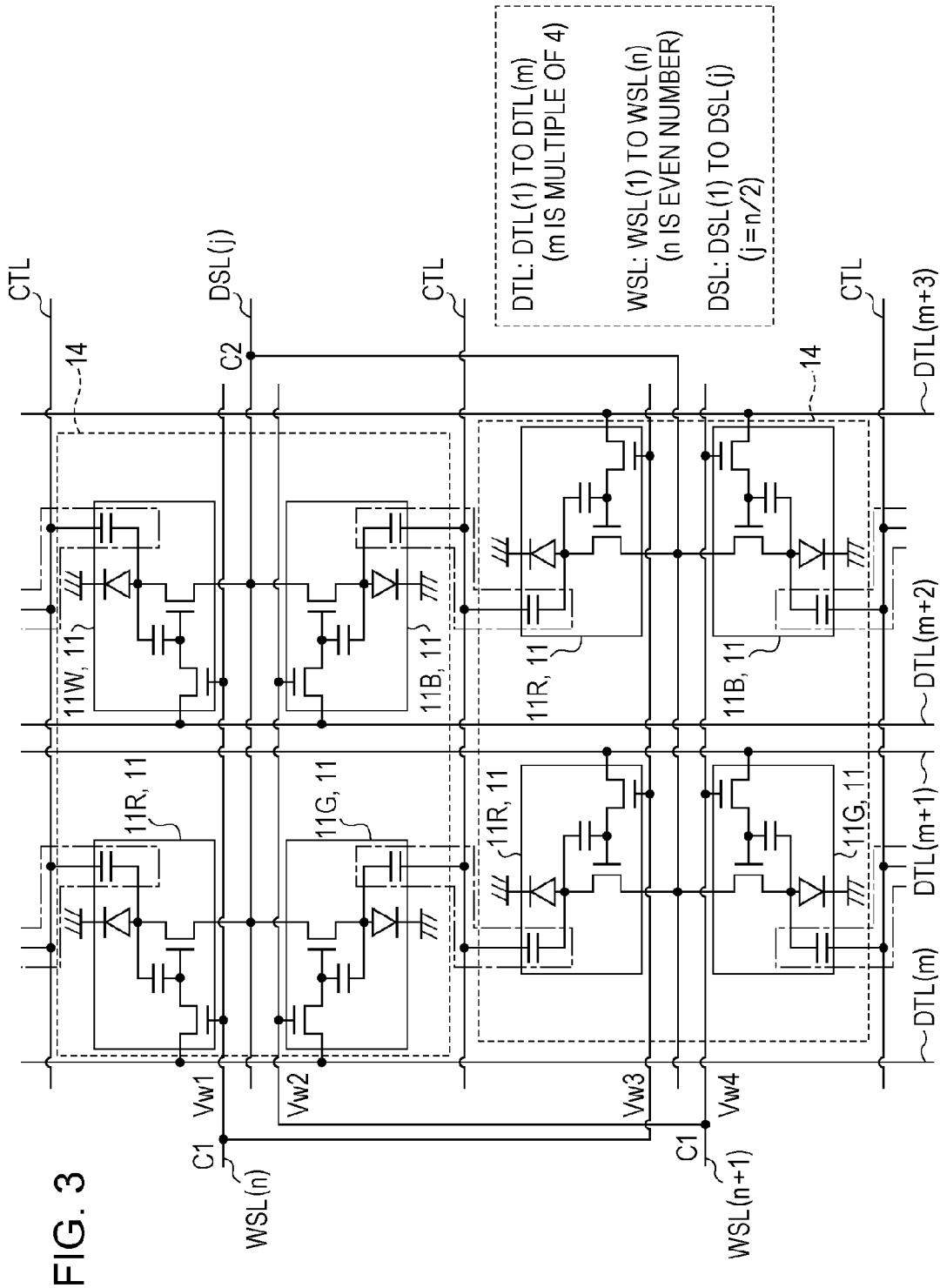
FIG. 3 is a diagram showing an example of a circuit configuration of two display pixels adjacent to each other in a row direction.
Figure 4:
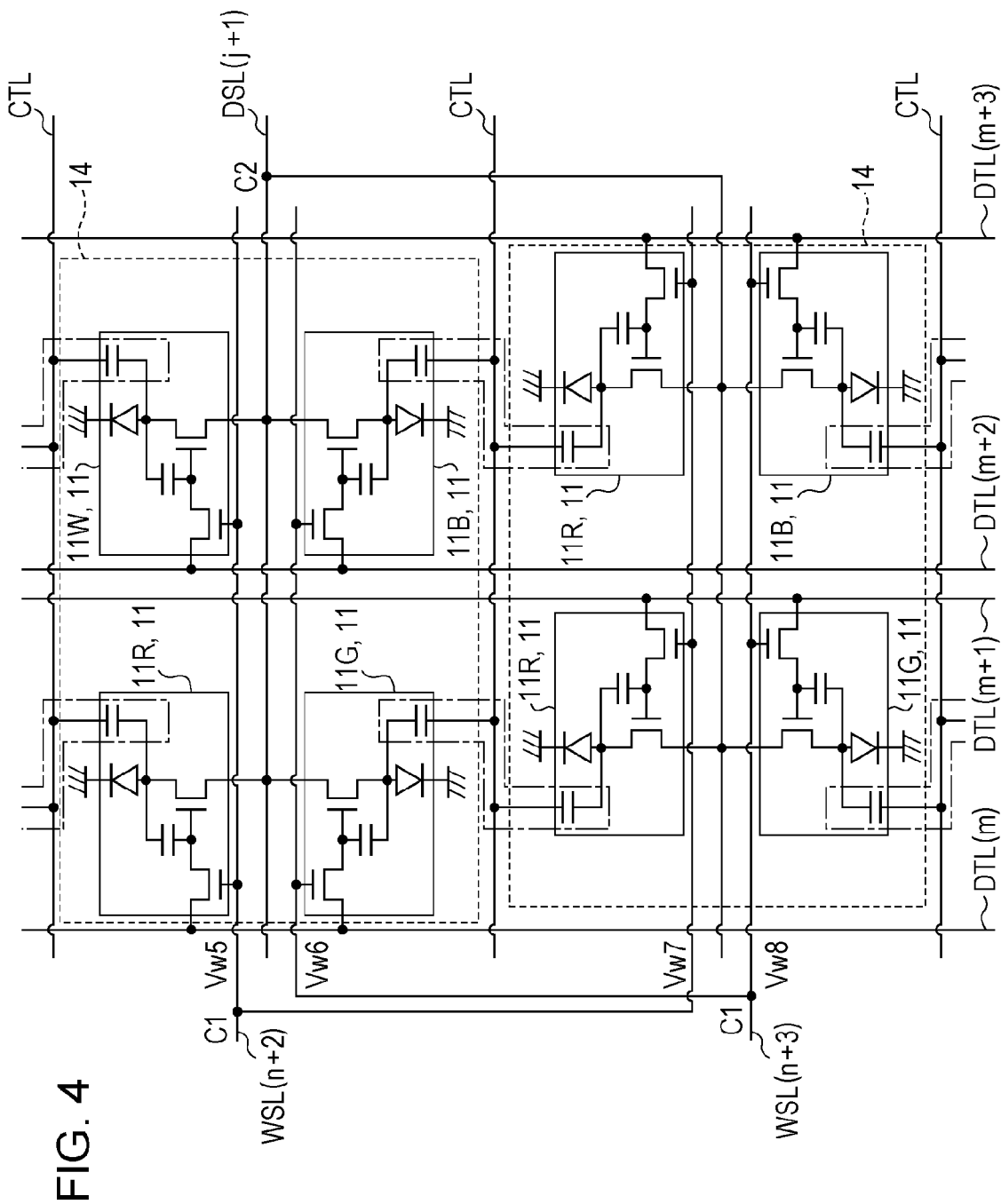
FIG. 4 is a diagram showing another example of a circuit configuration of two display pixels adjacent to each other in a row direction.

FIGS. 3 and 4 show examples of circuit configurations in two display pixels 14 (to be described later) adjacent to each other in the column direction. FIG. 3 shows an example of a circuit configuration of each display pixel 14 in $n^{th}$ and $n+1^{th}$ display pixel rows ($1 \leq n < N$, and N is the total number of display pixel rows (even number)). FIG. 4 shows an example of a circuit configuration of each display pixel 14 in $n+2^{th}$ and $n+3^{th}$ display pixel rows. The display pixel row herein refers to a line formed by a plurality of display pixels 14 disposed in the row direction. On the other hand, a pixel row refers to a line formed by a plurality of pixels 11 disposed in the row direction, and corresponds to a sub pixel row. Hereinafter, in order to avoid confusion between a pixel row and a display pixel row, the pixel row will be referred as a sub pixel row. There are L sub pixel rows for every display pixel row, where L is equal to or greater than two and equal to or less than the number of display colors. In the present embodiment, there are two sub pixel rows for every display pixel row, but other configurations are certainly within the scope of the subject matter of the disclosure.

Display pixels in the $n^{th}$ display pixel row and an $n+2^{th}$ display pixel row have similar circuit layouts as each other, while display pixels in the $n+1^{th}$ display pixel row and an n+3th display pixel row have similar circuit layouts as each other. Hereinafter, in order to avoid overlapping description, the circuit layout of each pixel 11 in the $n+2^{th}$ display pixel row and the $n+3^{th}$ display pixel row will not be described.

Each of the pixels 11 corresponds to a point of a minimum unit constituting the screen on the display panel 10. The display panel 10 is a color display panel, and the pixels 11 correspond to sub pixels emitting light of a single color, for example, red, green, blue, white, or the like. It should be noted that the pixels 11 may correspond to sub pixels emitting light of a single color, for example, red, green, blue, yellow, or the like.

In the present embodiment, the display pixel 14 is constituted by four pixels 11 emitting different colors, but other configurations are certainly within the scope of the subject matter of the disclosure. In other words, the number of kinds of emitted light colors is 4, and the number of pixels 11 included in each display pixel 14 is also 4. The four pixels 11 included in the display pixel 14 are, for example, a pixel 11R emitting red light, a pixel 11G emitting green light, a pixel 11B emitting blue light, and a pixel 11W emitting white light. In each display pixel 14, four pixels 11 are disposed in a 2×2 matrix forming a so-called cross-in-square arrangement (4 squares) (i.e., L=2). In addition, in each display pixel 14, the arrangement of the four pixels 11 is the same. For example, as shown in FIG. 3, the pixel 11R is disposed in the upper left part of the cross-in-square shape, the pixel 11G is disposed in the lower left part of the cross-in-square shape, the pixel 11B is disposed in the lower right part of the cross-in-square shape, and the pixel 11W is disposed in the upper right part of the cross-in-square shape.

The display pixel rows are grouped into drive units that each include k display pixel rows (k≥2). Each drive unit includes L unit write scanning lines WSL. The number of display pixel rows included in one drive unit (k) is equal to or higher than 2 and equal to or lower than the number of kinds of emitted light colors. In this particular embodiment, two unit write scanning lines WSL and two display pixel rows are included in each drive unit (i.e., L=2 and k=2). The total number of unit write scanning lines WSL is equal to the total number of display pixel rows, which is N. It should be noted that n in FIG. 3 is a positive integer which is equal to or greater than 1 and equal to or lower than N. WSL(n) in FIG. 3 means an $n^{th}$ ($n^{th}$ row) unit write scanning line WSL.

Each unit write scanning line WSL is connected to all of the pixels 11 in its respective drive unit that have a particular emitted light color. In this particular embodiment, of the two unit write scanning lines WSL(n) and WSL(n+1) included in one drive unit, the unit write scanning line WSL(n) is connected to all of the red pixels 11R and all of white pixel 11W included in the one drive unit, and the unit write scanning line WSL(n+1) is connected to all of the green pixels 11G and all of the blue pixels 11B included in the one drive unit. In two display pixels 14 located in different rows in one drive unit and adjacent to each other in the column direction, the combination of emitted light colors of pixels 11 having two kinds of emitted light colors shared by each scanning line WSL are the same.

Each of the unit write scanning lines WSL (WSL(n) to WSL(n+3)) is constituted by plural write scanning lines (branches) configured as a common line, where each unit write scanning line WSL includes the same number of constituent individual write scanning lines (branches) as the number of display pixel rows included in one drive unit (i.e., k branches) (in this particular embodiment, two branches (a first wiring and a second wiring)). Each individual write scanning line (branch) is allocated to one sub pixel row. In a single drive unit, the branches of a given unit write scanning line WSL are respectively connected to similarly-situated sub pixel rows of the display pixel rows included in the drive unit, such that each pixel in the drive unit of a same color is connected to a same unit write scanning line WSL. For example, in this particular embodiment, the branches of the unit write scanning line WSL(n) are connected to the upper sub pixel rows of the two display pixel rows included in the drive unit, while the branches of the unit write scanning line WSL(n+1) are connected to the lower sub pixel rows of the two display pixel rows included in the drive unit. In this particular embodiment, each branch of a given unit write scanning line is connected to each other branch of thereof within the display panel 10. Connection points C1 of branches may be within the display region 10A, or in the margin (frame region) of the display region 10A. In addition, as viewed from the normal line direction of the display panel 10, a portion of each unit write scanning line WSL intersects another unit write scanning line WSL within the same unit at some point. The branch of each unit write scanning line WSL traverses the center of the cross-in-square shape arrangement. A gate electrode 14A of the writing transistor Tr2 is connected to a branch of unit write scanning lines WSL.

The plurality of unit power source lines DSL are allocated by one for one drive unit. Thus, the number of unit power source lines DSL included in one drive unit is 1. The total number of unit power source lines DSL is J (=N/k). In this particular embodiment, k=2, and thus J=N/2, corresponding to a half of the total number of display pixel rows. It should be noted that j in FIG. 3 is a positive integer that is equal to or greater than 1 and equal to or smaller than N/2, and DSL(j) in FIG. 3 means $j^{th}$ power source line DSL. Each unit power source line DSL is connected to all pixels 11 of one drive unit. To be specific, one unit power source line DSL included in one drive unit is connected to all pixels 11 included in the one drive unit (11R, 11G, 11B, and 11W).

Furthermore, each unit power source line DSL is constituted by plural power source lines (branches) configured as a common line, each unit power source line DSL including k constituent individual power source lines (branches), i.e. the same number as that of display pixel rows included in one unit (in this particular embodiment, two branches). In this particular embodiment, each of the branches of the unit power source line DSL (DSL(j) or DSL (j+1)) is connected to each other within the display panel 10. A connection point C2 of branches may be located within the display region 10A, or may be within the margin of the display region 10A (frame region). By providing branches in unit write scanning lines WSL and unit power source lines DSL in this manner, the interval between the unit scanning lines WSL and the interval between the unit power source lines DSL can be widened. As a result, the wiring layout becomes easy. Each branch of a power source line DSL traverses the center of the cross-in-square arrangement.

While the branched configuration of the unit power source lines DSL and unit write scanning lines WSL is described in the illustrative example, the disclosure is not limited to that specific configuration. In particular, in this disclosure and the appended claims, multiple wirings are "configured as a common line" when those wirings have the same voltages applied thereto at the same timings. This might be the case, for example, because the wirings are directly connected to each other (as in the branched configuration discussed above_). However, multiple wirings that are "configured as a common line" do not have to be directly connected to each other as long as the same voltages are applied thereto at the same timings (i.e., they are effectively treated as the same line, although physically they are separate). For example, a driving circuit may be configured to apply the same voltages to plural wirings at the same timings, in which case the plural wirings would be "configured as a common line."

Signal lines DTL are provided extending in a column direction. The number of signal lines DTL per column of sub pixels 11 is the same as the number of display pixel rows per drive unit (k). In the present embodiment, k=2, and thus there are two signal lines DTL for each column of sub pixels 11. Within one drive unit, each signal line DTL is connected to all of the pixels 11 of one display pixel that are in a single column corresponding to the signal line DTL. Thus, in the present embodiment as shown in FIG. 3, the signal line DTL(m) is connected to both of the pixels 11 of the first display pixel that are in the first column of pixels 11, the signal line DTL(m+1) is connected to both of the pixels 11 of the second display pixel that are in the first column of pixels 11, the signal line DTL(m+2) is connected to both of the pixels 11 of the first display pixel that are in the second column of pixels 11, and signal line DTL(m+3) is connected to both of the pixels 11 of the second display pixel that are in the second column of pixels 11. In the example of FIG. 3, the plurality of signal lines DTL are allocated by two for each display pixel 14 in each display pixel row. Out of two signal lines DTL allocated for each display pixel 14 in each display pixel row, one signal line DTL is connected to pixels 11 having two kinds of emitted light colors that do not share the same unit write scanning line WSL, and the other signal line DTL is connected to pixels 11 having the remaining two kinds of emitted light colors. Hereinafter, the embodiment of the connection described above will be described focusing on two display pixels 14 adjacent to each other in the column direction among the plurality of display pixels 14 included in $n^{th}$ and $n+1^{th}$ display pixel rows. It should be noted that the two display pixels 14 described above correspond to two display pixels 14 which are in different display pixel rows from each other within one drive unit and adjacent to each other in the column direction.

The display pixel 14 included in the $n^{th}$ display pixel row out of the two display pixels 14 is allocated with two signal lines DTL(m) and DTL(m+2). Furthermore, the display pixel 14 included in the $n+1^{th}$ display pixel row out of the two display pixels 14 is allocated with two signal lines DTL(m+1) and DTL(m+3). In other words, for the two display pixels 14 which are in different display pixel rows from each other within one drive unit and adjacent to each other in the column direction, two signal lines DTL(m) and DTL(m+2) in even-numbered columns are allocated to one display pixel 14, and two signal lines DTL(m+1) and DTL(m+3) in the odd-numbered columns are allocated to the other display pixel 14. Accordingly, the total number of signal lines DTL is suppressed to the minimum.

The plurality of signal lines DTL are allocated by four for each two display pixels 14 adjacent to each other in the column direction. Thus, the total number of signal lines DLT is M, where M=k·C and C is the total number of columns of sub pixel circuits. In FIG. 3, m is a positive integer that is equal to or greater than 1 and equal to or smaller than M−4, and is a number equivalent to [a multiple of 4+1] when it is other than 1. Thus, DTL(m) in FIG. 3 means $m^{th}$ signal line DTL. To two display pixels 14 adjacent to each other in the column direction, for example, four signal lines DTL(m), DTL(m+1), DTL(m+2), and DTL(m+3) are allocated. The four signal lines DTL(m), DTL(m+1), DTL(m+2), and DTL (m+3) are disposed in this order in the row direction. In each display pixel 14, two pixels 11 on the left side out of four pixels 11 are interposed between the signal line DTL(m) and the signal line DTL(m+1) in the row direction. In addition, in each display pixel 14, two pixels 11 on the right side out of the four pixels 11 are interposed between the signal line DTL(m+2) and the signal line DTL(m+3) in the row direction.

In addition, in two display pixels 14 which are in different display pixel rows within one drive unit and adjacent to each other in the column direction, two pixels 11 having the same emitted light color are disposed between two shared signal lines DTL. To be specific, in two display pixels 14 which are in different display pixel rows within one drive unit and adjacent to each other in the column direction, two pixels 11R are disposed between two signal lines DTL(m) and DTL(m+1). In the same manner, in two display pixels 14 which are in different display pixel rows within one drive unit and adjacent to each other in the column direction, two pixels 11G are disposed between two signal lines DTL(m) and DTL(m+1). In addition, in two display pixels 14 which are in different display pixel rows within one unit and adjacent to each other in the column direction, two pixels 11B are disposed between two signal lines DTL(m+2) and DTL(m+3). In addition, in two display pixels 14 which are in different display pixel rows within one drive unit and adjacent to each other in the column direction, two pixels 11W are disposed between two signal lines DTL(m+2) and DTL(m+3).

The two signal lines DTL(m) and DTL(m+2) described above are connected to pixels 11 having two kinds of emitted light colors not sharing a scanning line WSL. To be specific, the signal line DTL(m) is connected to pixels 11R and 11G having two kinds of emitted light colors not sharing a scanning line WSL, and the signal line DTL(m+2) is connected to pixels 11B and 11W having two kinds of emitted light colors not sharing a scanning line WSL. Furthermore, to one of the two display pixels 14 which is included in $n+1^{th}$ display pixel row, two signal lines DTL(m+1) and DTL(m+3) are allocated. The two signal lines DTL(m+1) and DTL (m+3) are connected to pixels 11 having two kinds of emitted light colors not sharing a scanning line WSL. To be specific, the signal line DTL(m+1) is connected to pixels 11R and 11G having two kinds of emitted light colors not sharing a scanning line WSL, and the signal line DTL(m+3) is connected to pixels 11B and 11W having the remaining two kinds of emitted light colors.

The plurality of cathode lines CTL are allocated by one for every two sub pixel rows. To be specific, the plurality of cathode lines CTL are allocated by one for every two sub pixel rows which are adjacent to each other in the column direction and in different display pixel rows from each other. For example, as shown in FIG. 3, a pixel 11G that is one sub pixel in the lower part of an $n^{th}$ display pixel row and a pixel 11R that is one sub pixel in the upper part of an $n+1^{th}$ display pixel row are connected to a shared cathode line CTL. In the same manner, for example, a pixel 11G that is one sub pixel in the lower part of the $n+1^{th}$ display pixel row and a pixel 11R that is one sub pixel in the upper part of an $n+2^{th}$ display pixel row are connected to a shared cathode line CTL. In addition, as shown in FIG. 3, for example, a pixel 11B that is one sub pixel in the lower part of the $n^{th}$ display pixel row and a pixel 11W that is one sub pixel in the upper part of the $n+1^{th}$ display pixel row are connected to the shared cathode line CTL. In the same manner, for example, a pixel 11B that is one sub pixel in the lower part of the $n+1^{th}$ display pixel row and a pixel 11W that is one sub pixel in the upper part of the $n+2^{th}$ display pixel row are connected to the shared cathode line CTL.

Each cathode line CTL is connected to all auxiliary capacitors Csub included in two allocated sub pixel rows. For example, as shown in FIG. 3, auxiliary capacitors Csub of all pixels 11G and 11B included in the sub pixel row in the lower part of the $n^{th}$ display pixel row and auxiliary capacitors Csub of all pixels 11R and 11W included in a sub pixel row in the upper part of the $n+1^{th}$ display pixel row are connected to a shared cathode line CTL. In the same manner, for example, as shown in FIGS. 3 and 4, auxiliary capacitors Csub of all pixels 11G and 11B included in a sub pixel row in the lower part of the $n+1^{th}$ display pixel row and auxiliary capacitors Csub of all pixels 11R and 11W included in the sub pixel row in the upper part of the $n+2^{th}$ display pixel row are connected to a shared cathode line CTL.

Drive Circuit 20

Next, the drive circuit 20 will be described. The drive circuit 20 has, for example, the timing generation circuit 21, the video signal processing circuit 22, the signal line drive circuit 23, the scanning line drive circuit 24, and the power source line drive circuit 25, as described above. The timing generation circuit 21 controls such that each of circuits in the drive circuit 20 are operated in conjunction with each other. The timing generation circuit 21 causes the above-described circuits to output control signals 21A according to (in synchronization with) the synchronization signals 20B input from outside.

The video signal processing circuit 22 performs predetermined correction on, for example, digital video signals 20A input from outside, and outputs video signals 22A obtained therefrom to the signal line drive circuit 23. As the predetermined correction, for example, gamma correction, overdrive correction, and the like are exemplified.

The signal line drive circuit 23 applies an analog signal voltage corresponding to the video signals 22A input from the video signal processing circuit 22 to each signal line DTL according to (in synchronization with), for example, inputs of the control signals 21A. The signal line drive circuit 23 can output, for example, two kinds of voltages (Vofs and Vsig). To be specific, the signal line drive circuit 23 supplies the two kinds of voltages (Vofs and Vsig) to pixels 11 selected by the scanning line drive circuit 24 via signal lines DTL.

Figure 5:
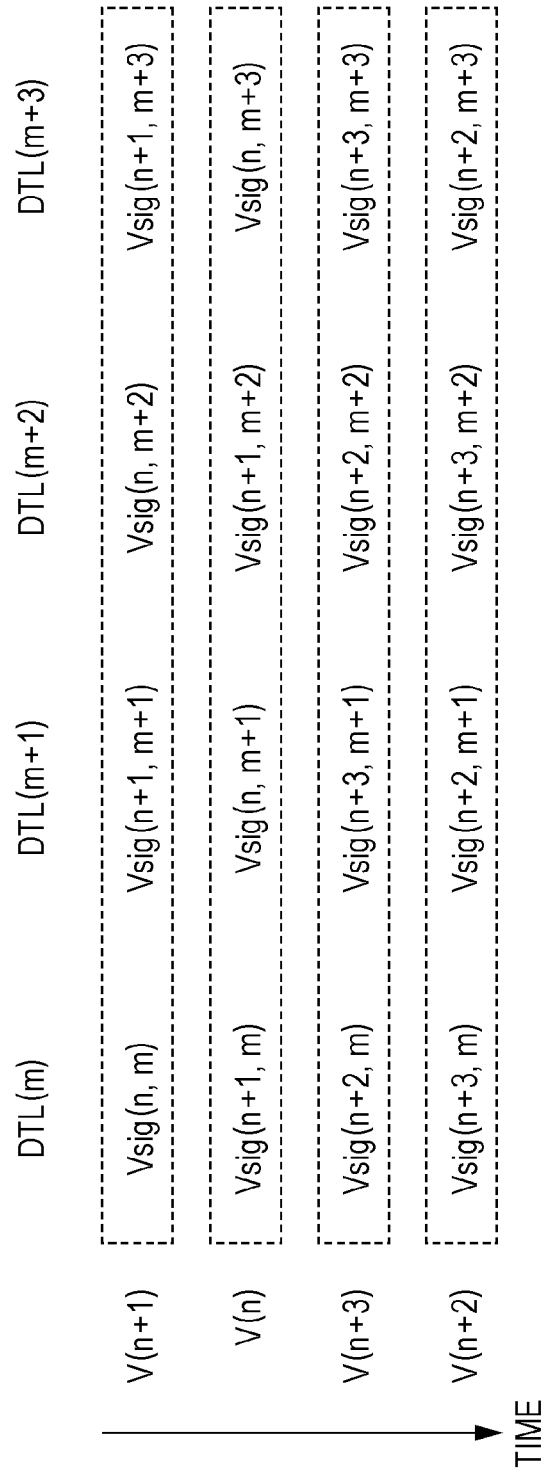
FIG. 5 is a diagram showing an example of a voltage applied to DTL of FIGS. 3 and 4.

FIG. 5 shows an example of signal voltages V(n), V(n+1), V(n+2), and V(n+3) applied to, in order, to four signal lines DTL (DTL(m), DTL(m+1), DTL(m+2), and DTL(m+3)) connected to four display pixels 14 arranged in the column direction in two drive units adjacent to each other in the column direction according to scanning of unit write scanning lines WSL. The signal line drive circuit 23 is designed to output the signal voltage V(n) in response to selection of the unit write scanning line WSL(n), and outputs the signal voltage V(n+1) in response to selection of the unit write scanning line WSL(n+1). In the same manner, the signal line drive circuit 23 is designed to output the signal voltage V(n+2) in response to selection of the unit write scanning line WSL(n+2), and outputs the signal voltage V(n+3) in response to selection of the unit write scanning line WSL (n+3). Here, the scanning line drive circuit 24 is designed to select the unit write scanning lines WSL in order of the WSL(n+1), the WSL(n), the WSL(n+3), and the WSL(n+2) during writing of signal voltages, as described later. For this reason, the signal line drive circuit 23 is designed to output the signal voltages Vsig in order of V(n+1), V(n), V(n+3), and V(n+2) during writing of signal voltages.

The signal line drive circuit 23 is designed to supply the voltages Vsig (Vsig(n, m) and Vsig(n, m+2)) corresponding to the $n^{th}$ display pixel row to the plurality of pixels 11 that belong to the $n^{th}$ display pixel row out of the plurality of pixels 11 simultaneously selected by the scanning line drive circuit 24 via the signal lines DTL(m) and DTL(m+2) in the even-numbered columns, for example, as shown in FIG. 5. Furthermore, the signal line drive circuit 23 is designed to supply the voltages Vsig (Vsig(n+1, m+1) and Vsig(n+1, m+3)) corresponding to the $n+1^{th}$ display pixel row to the plurality of pixels 11 that belong to the $n+1^{th}$ display pixel row out of the plurality of pixels 11 simultaneously selected by the scanning line drive circuit 24 via the signal lines DTL(m+1) and DTL(m+3) in the odd-numbered columns.

In other words, the signal line drive circuit 23 is designed to output the voltages Vsig(n, m) and Vsig(n, m+2) corresponding to the $n^{th}$ display pixel row to the signal lines DTL(m) and DTL(m+2) in the even-numbered columns, and at the same time, the voltages Vsig(n+1, m+1) and Vsig(n+1, m+3) corresponding to the $n+1^{th}$ display pixel row to the signal lines DTL(m+1) and DTL(m+3) in the odd-numbered columns when the scanning line WSL(n) is selected during signal writing. In addition, the signal line drive circuit 23 is designed to output the voltages Vsig(n+1, m) and Vsig(n+1, m+2) corresponding to the $n+1^{th}$ display pixel row to the signal lines DTL(m) and DTL(m+2) in the even-numbered columns, and at the same time, the voltages Vsig(n, m+1) and Vsig(n, m+3) corresponding to the $n^{th}$ display pixel row to the signal lines DTL(m+1) and DTL(m+3) in the odd-numbered columns when the scanning line WSL(n+1) is selected during signal writing. It should be noted that the signal line drive circuit 23 applies voltages with respect to $n+2^{th}$ and n+3th display pixel rows in the same manner as in the $n^{th}$ and $n+1^{th}$ display pixel rows.

Vsig is a voltage value corresponding to the video signal 20A. Vofs is a constant voltage irrelevant to the video signal 20A. The minimum voltage of Vsig is a voltage value lower than Vofs, and the maximum voltage of Vsig is a voltage value higher than Vofs.

Out of a plurality of pixels 11 simultaneously selected by the scanning line drive circuit 24, two pixels 11 disposed between the even-numbered signal line DTL(m) and the odd-numbered signal line DTL(m+1) are pixels having the same emitted light color. In the same manner, out of the plurality of pixels 11 simultaneously selected by the scanning line drive circuit 24, two pixels 11 disposed between the even-numbered signal line DTL(m+2) and the odd-numbered signal line DTL(m+3) are also pixels having the same emitted light color. Thus, the signal line drive circuit 23 outputs the voltage Vsig corresponding to pixels having the same emitted light color to the signal lines DTL(m) and DTL(m+1), and at the same time, outputs the voltage Vsig corresponding to pixels having another same emitted light color to the signal lines DTL(m+2) and DTL(m+3) when the unit write scanning line WSL(n) is selected. For example, the signal line drive circuit 23 outputs the voltage Vsig corresponding to the a pixel 11R to the signal lines DTL(m) and DTL(m+1), and at the same time, outputs the voltage Vsig corresponding to the a pixel 11W to the signal lines DTL(m+2) and DTL(m+3) when the unit write scanning line WSL(n) is selected.

The scanning line drive circuit 24 executes Vth correction, writing of a signal voltage Vsig, and μ correction in a desired order by selecting a plurality of scanning lines WSL in a predetermined sequence according to (in synchronization with), for example, inputs of the control signals 21A. Here, Vth correction refers to a correcting operation in which a voltage Vgs between the gate sources of the drive transistor Tr1 is brought in proximity to a threshold voltage of the drive transistor. Writing of a signal voltage Vsig (signal writing) refers to an operation in which a signal voltage Vsig is written in the gate of the drive transistor Tr1 via the writing transistor Tr2. μ correction refers to an operation in which the voltage Vgs held between the gate sources of the drive transistor Tr1 is corrected according to the magnitude of the degree of movement μ of the drive transistor Tr1. Signal writing and μ correction may be performed at different timings. In the present embodiment, the scanning line drive circuit 24 performs signal writing and μ correction at the same time (or in a continuous manner without a pause) by outputting one selected pulse to unit write scanning lines WSL.

Figure 6:
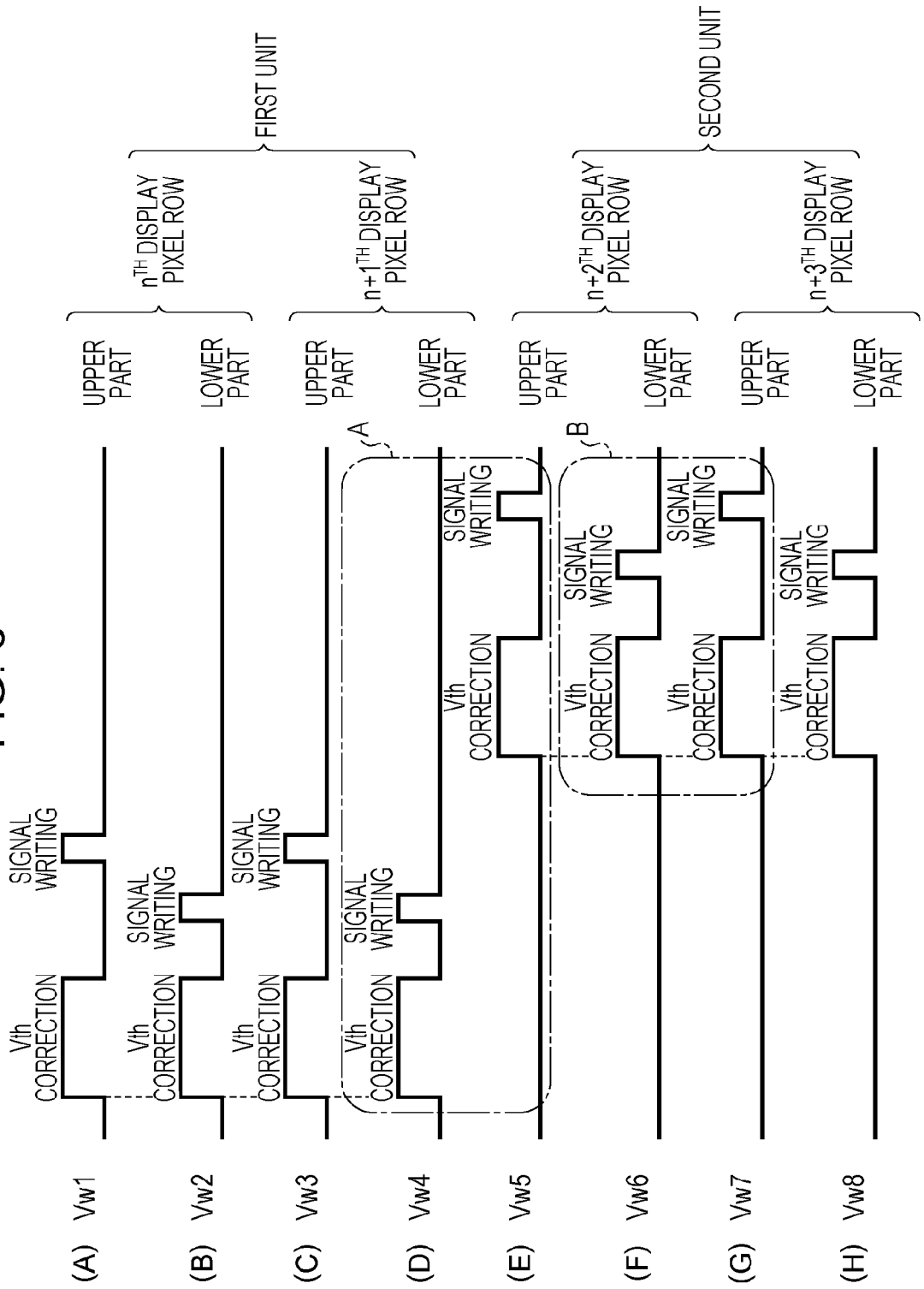
FIG. 6 is a waveform diagram showing an example of a temporal change of a selected pulse applied to each pixel (sub pixel) row when two units adjacent to each other in a row direction are focused.

Meanwhile, the drive circuit 20 executes Vth correction and signal writing one drive unit at a time. To be specific, the drive circuit 20 executes Vth correction and signal writing for a first drive unit, and then executes Vth correction and signal writing for a second drive unit adjacent to the first drive unit in the column direction as shown in FIG. 6, and so on. In other words, the drive circuit 20 executes the series of operations (Vth correction and signal writing) for each individual drive unit separately in a sequential order.

FIG. 6 shows an example of a temporal change of a selected pulse applied to each of sub pixel rows within two drive units adjacent to each other in the column direction. In FIG. 6, Vw1 is a voltage waveform of a branch of a unit write scanning line WSL(n) provided corresponding to the sub pixel row in the upper part of the $n^{th}$ display pixel row. Vw2 is a voltage waveform of a branch of the unit write scanning line WSL(n+1) provided corresponding to the sub pixel row in the lower part of the $n^{th}$ display pixel row. Vw3 is a voltage waveform of a branch of a unit write scanning line WSL(n) provided corresponding to the sub pixel row in the upper part of the $n+1^{th}$ display pixel row. Vw4 is a voltage waveform of a branch of the unit write scanning line WSL(n+1) provided corresponding to the sub pixel row in the lower part of the $n+1^{th}$ display pixel row. Vw5 is a voltage waveform of a branch of a unit write scanning line WSL(n+2) provided corresponding to the sub pixel row in the upper part of the $n+2^{th}$ display pixel row. Vw6 is a voltage waveform of a branch of the unit write scanning line WSL(n+3) provided corresponding to the sub pixel row in the lower part of the $n+2^{th}$ display pixel row. Vw7 is a voltage waveform of a branch of a unit write scanning line WSL(n+2) provided corresponding to the sub pixel row in the upper part of the $n+3^{th}$ display pixel row. Vw8 is a voltage waveform of a branch of the unit write scanning line WSL(n+3) provided corresponding to the sub pixel row in the lower part of the $n+3^{th}$ display pixel row. It should be noted that A and B surrounded by the dashed lines in FIG. 6 will be described later.

During Vth correction, the scanning line drive circuit 24 is designed to select all unit write scanning lines WSL included in one drive unit at the same time (or at similar times). To be specific, the scanning line drive circuit 24 is designed to select two unit write scanning lines WSL(n) and WSL(n+1) included in one drive unit at the same time (or at similar times) during Vth correction. In other words, the scanning line drive circuit 24 is designed to select the plurality of pixels 11 (for example, the pixels 11R and 11W) included in the sub pixel row in the upper part of the $n^{th}$ display pixel row, the plurality of pixels 11 (for example, the pixels 11G and 11B) included in the sub pixel row in the lower part of the $n^{th}$ display pixel row, the plurality of pixels 11 (for example, the pixels 11R and 11W) included in the sub pixel row in the upper part of the $n+1^{th}$ display pixel row, and the plurality of pixels 11 (for example, the pixels 11G and 11B) included in the sub pixel row in the lower part of the $n+1^{th}$ display pixel row at the same time (or at similar times) during Vth correction.

Furthermore, the scanning line drive circuit 24 is designed to select during a signal writing operation a plurality of unit write scanning lines WSL included in one drive unit in an order progressing in a direction opposite to the scanning direction of scanning drive units (hereinafter, referred to as a "drive unit scanning direction"). The drive unit scanning direction is, for example, a direction parallel to the direction extending from the upper end side of the display panel 10 to the lower end side thereof. Thus, the scanning line drive circuit 24 executes signal writing into each pixel 11 in one display pixel row on each pixel 11 connected to the second wiring (lower sub pixel row), and then executes the operation on each pixel 11 connected to the first wiring (upper sub pixel row). It should be noted that the drive unit scanning direction may be a direction parallel to the direction extending from the lower end side of the display panel 10 to the upper end side thereof. In this case, although not shown in FIG. 6, the scanning line drive circuit 24 is designed to execute signal writing into each pixel 11 in one display pixel row on each pixel 11 connected to the first wiring, and then execute the operation on each pixel 11 connected to the second wiring.

The scanning line drive circuit 24 is designed to select the two unit write scanning lines WSL(n) and WSL(n+1) included in one drive unit in order of the unit write scanning line WSL(n+1) and the unit write scanning line WSL(n) during signal writing. For this reason, the scanning line drive circuit 24 simultaneously selects the plurality of pixels 11 included in the sub pixel row in the lower part of the $n^{th}$ display pixel row and the plurality of pixels 11 included in the sub pixel row in the lower part of the $n+1^{th}$ display pixel row via the unit write scanning line WSL(n+1), and then selects the plurality of pixels 11 included in the sub pixel row in the upper part of the $n^{th}$ display pixel row and the plurality of pixels 11 included in the sub pixel row in the upper part of the $n+1^{th}$ display pixel row via the unit write scanning line WSL(n) during signal writing.

The scanning line drive circuit 24 can output, for example, two kinds of voltages (Von and Voff). To be specific, the scanning line drive circuit 24 supplies the two kinds of voltages (Von and Voff) via the unit write scanning lines WSL to pixels 11 to be driven so as to control the writing transistor Tr2 to be on and off. The Von herein has a value equal to or higher than an on voltage of the writing transistor Tr2. The Von is a crest value of a writing pulse output from the scanning line drive circuit 24 in "the second half part of a Vth correction preparation period", a "Vth correction period", and a "signal writing/μ correction period", and the like to be described later. The Voff is a value lower than an on voltage of the writing transistor Tr2, and also a value lower than the Von. The Voff is a crest value of a writing pulse output from the scanning line drive circuit 24 in "the first half part of the Vth correction preparation period", a "light emission period", and the like to be described later.

The power source line drive circuit 25 sequentially selects the plurality of power source lines DSL in predetermined drive units according to (in synchronization with), for example, inputs of the control signals 21A. The power source line drive circuit 25 can output, for example, two kinds of voltages (Vcc and Vss). The power source line drive circuit 25 is designed to supply the two kinds of voltages (Vcc and Vss) to one entire drive unit that includes pixels 11 (in other words, all pixels 11 included in one drive unit) selected by the scanning line drive circuit 24 via the power source lines DSL. The Vss herein is a voltage value that is lower than a voltage (Vel+Vcath) obtained by adding a threshold voltage Vel of the organic EL element 13 to a cathode voltage Vcath of the organic EL element 13. The Vcc is a voltage value equal to or greater than the voltage (Vel+Vcath).

Operation

Next, an operation of the display device 1 according to the present embodiment (an operation from light extinction to light emission) will be described. In order to maintain constant luminance of emitted light of the organic EL element 13 without being affected by temporal changes even when the I-V characteristic of the organic EL element 13 or a threshold voltage and the degree of movement of the drive transistor Tr1 exhibit such temporal changes, a compensating operation for variances of the I-V characteristic of the organic EL element 13 and a correction operation for variations of the threshold voltage and the degree of movement of the drive transistor Tr1 are incorporated in the present embodiment.

Figure 7:
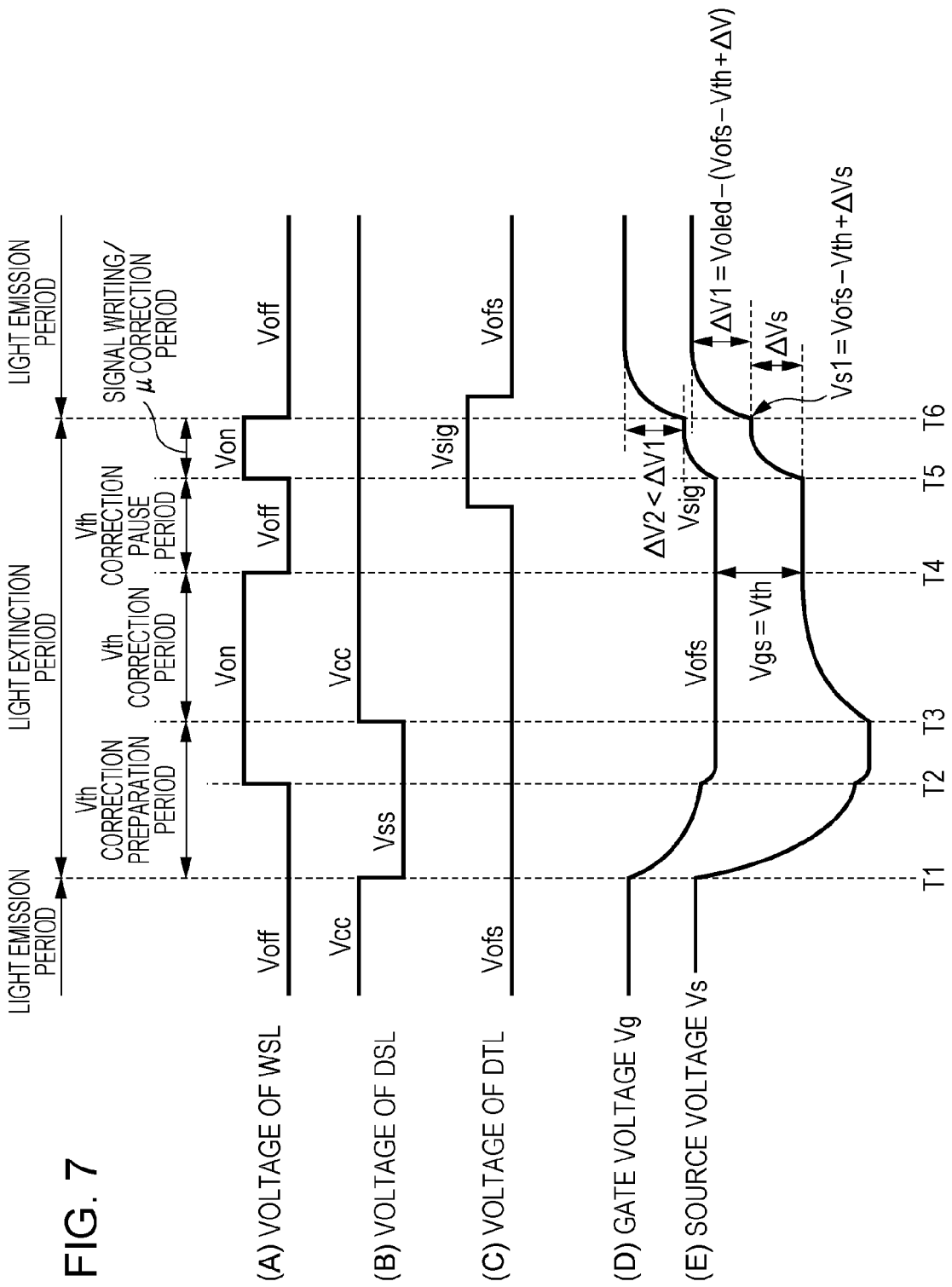
FIG. 7 is a waveform diagram showing an example of temporal changes of a voltage, a gate voltage, and a source voltage applied to WSL, DSL, and DTL when one pixel (sub pixel) is focused.

FIG. 7 shows an example of various waveforms exhibited in the display device 1. FIG. 7 shows a state in which binary voltage changes every moment are shown in a scanning line WSL, a power source line DSL, and a signal line DTL. Furthermore, FIG. 7 shows a state in which a gate voltage Vg and a source voltage Vs of the drive transistor Tr1 change every moment according to the voltage changes of the scanning line WSL, power source line DSL, and signal line DTL.

Vth Correction Preparation Period

First, the drive circuit 20 prepares Vth correction in which the voltage Vgs between the gate sources of the drive transistor Tr1 is brought in proximity to the threshold voltage of the drive transistor Tr1. To be specific, when a voltage of a scanning line WSL is Voff, a voltage of a signal line DTL is Vofs, and a voltage of a power source line DSL is Vcc (in other words, when the organic EL element 13 emits light), the power source line drive circuit 25 lowers the voltage of the power source line DSL from Vcc to Vss according to the control signals 21A (T1). Then, the source voltage Vs is lowered to Vss, and light of the organic EL element 13 extinguished. At this moment, the gate voltage Vg is also lowered by coupling via the holding capacitor Cs.

Next, while the voltage of the power source line DSL is Vss, and the voltage of the signal lines DTL is Vofs, the scanning line drive circuit 24 lowers the voltage of the scanning line WSL from Voff to Von according to the control signals 21A (T2). Then, the gate voltage Vs is lowered to vofs. At this moment, the potential difference Vgs between the gate voltage Vg and the source voltage Vs may be lower than, equal thereto, or greater than the threshold voltage of the drive transistor Tr1.

Vth Correction Period

Next, the drive circuit 20 performs Vth correction. To be specific, while the voltage of the signal line DTL is Vofs and the voltage of the scanning line WSL is Von, the power source line drive circuit 25 raises the voltage of the power source line DSL from Vss to Vcc according to the control signal 21A (T3). Then, a current Ids flows between drain sources of the drive transistor Tr1, and thereby the source voltage Vs rises. At this moment, when the source voltage Vs is lower than Vofs-Vth (when Vth correction has not been completed), the current Ids flows between the drain sources of the drive transistor Tr1 until the drive transistor Tr1 is in a cut-off state (until the potential difference Vgs reaches Vth). Accordingly, the gate voltage Vg becomes Vofs, and the source voltage Vs rises, and as a result, the holding capacitor Cs is charged to be Vth, and thereby the potential difference Vgs becomes Vth.

After that, before the signal line drive circuit 23 switches the voltage of the signal line DTL from Vofs to Vsig according to the control signal 21A, the scanning line drive circuit 24 lowers the voltage of the scanning line WSL from Von to Voff according to the control signal 21A (T4). Then, since the gate of the drive transistor Tr1 is in a floating state, the potential difference Vgs can be maintained to be Vth regardless of the magnitude of the voltage of the signal line DTL. In this manner, by setting the potential difference Vgs to be Vth, the luminance of emitted light of the organic EL element 13 can be free from unevenness even when the threshold voltage Vth of the drive transistor Tr1 is uneven for each pixel circuit 12.

Vth Correction Resting Period

After that, during a resting period of Vth correction, the signal line drive circuit 23 switches the voltage of the signal line DTL from Vofs to Vsig.

Signal Writing/μ Correction Period

After a Vth correction resting period ends (in other words, after Vth correction is completed), the drive circuit 20 writing of a signal voltage and μ correction according to a video signal 20A. To be specific, while the voltage of the signal line DTL becomes Vsig, and the voltage of the power source line DSL becomes Vcc, the scanning line drive circuit 24 raises the voltage of the scanning line WSL from Voff to Von according to a control signal 21A (T5) so that the gate of the drive transistor Tr1 is connected to the signal line DTL. Then, the gate voltage Vg of the drive transistor Tr1 becomes the voltage of the signal line DTL Vsig. At this moment, an anode voltage of the organic EL element 13 is still lower than a threshold voltage Vel of the organic EL element 13 in this state, and the organic EL element 13 is in a cut-off state. For this reason, the current Ids flows into the element capacitor Coled and the auxiliary capacitor Csub of the organic EL element 13 so as to charge the element capacitor Coled and the auxiliary capacitor Csub, and thus, the source voltage Vs is raised by ΔVs, and then the potential difference Vgs becomes Vsig+Vth−ΔVs. In this manner, μ correction is performed at the same time as writing. Here, as the degree of movement μ of the drive transistor Tr1 becomes greater, ΔVs also increases, and thus, by reducing the potential difference Vgs by ΔV before light emission, unevenness of the degree of movement μ of each pixel 11 can be eliminated.

Light Emission

Finally, the scanning line drive circuit 24 lowers the voltage of the scanning line WSL from Von to Voff according to a control signal 21A (T6). Then, the gate of the drive transistor Tr1 is in a floating state, the current Ids flows between the drain sources of the drive transistor Tr1, and the source voltage Vs thereby increases. As a result, a voltage that is equal to or higher than the threshold voltage Vel is applied to the organic EL element 13, and the organic EL element 13 emits light with desired luminance.

Figure 8:
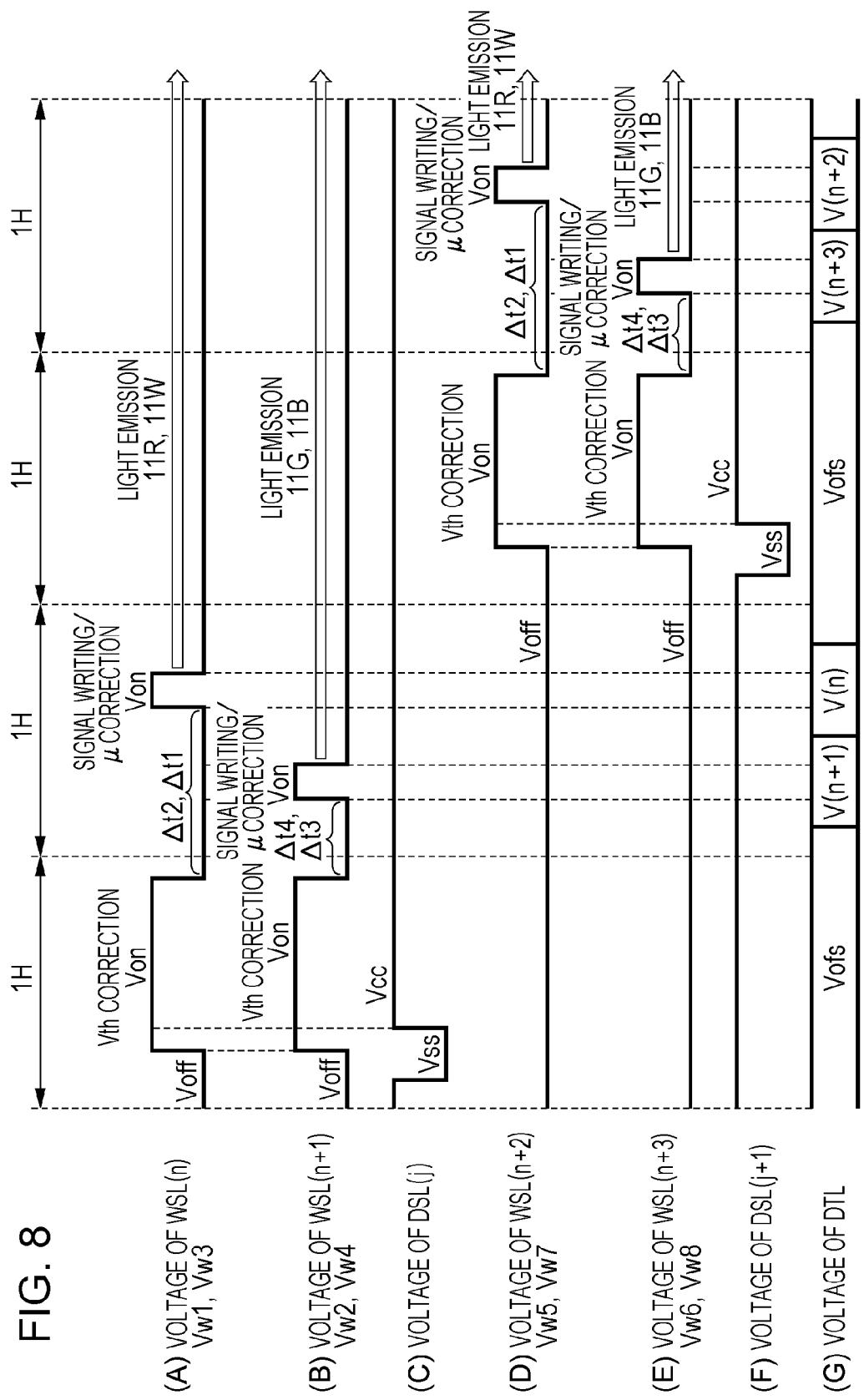
FIG. 8 is a waveform diagram showing an example of a temporal change of voltages applied to WSL, DSL, and DTL when two units adjacent to each other in a row direction are focused.

Next, an example of scanning of Vth correction and signal writing/μ correction in the display device 1 according to the present embodiment will be described referring to FIGS. 7 and 8. It should be noted that FIG. 8 shows an example of scanning of Vth correction and signal writing/μ correction in two drive units adjacent to each other in the column direction.

It should be noted that, hereinbelow, description will be provided on the assumption that all pixels 11 within one drive unit are divided into groups for each connected scanning line WSL. In the present embodiment, all pixels 11R and all pixels 11W within one drive unit are assumed to be one group, and all pixels 11G and all pixels 11B within the drive unit are assumed to be one group. Thus, hereinafter, all pixels 11R and all pixels 11W in one drive unit to which the scanning lines WSL(n) and WSL(n+1) form a first group, and all pixels 11G and all pixels 11B in the drive unit form a second group. Furthermore, all pixels 11R and all pixels 11W in one drive unit to which the scanning lines WSL(n+2) and WSL(n+3) form a third group, and all pixels 11G and all pixels 11B in the drive unit form a fourth group.

The drive circuit 20 performs Vth correction on all groups in one drive unit (the first and second groups) at similar times, and then, performs signal writing on all of the groups in the drive unit (the first and second groups) in order of groups. At this moment, the drive circuit 20 performs the signal writing on the second group including the pixels 11 disposed in the lower part of one display pixel row, and then on the first group including the pixels 11 disposed on the upper part of the display pixel row.

After that, the drive circuit 20 performs Vth correction on all groups in the next drive unit (the third and fourth groups) at similar times, and then, performs signal writing on all of the groups in the drive unit (the third and fourth groups) in order of groups. At this moment, the drive circuit 20 performs the signal writing on the fourth group including the pixels 11 disposed in the lower part of one display pixel row, and then on the third group including the pixels 11 disposed on the upper part of the display pixel row.

At this moment, the drive circuit 20 performs Vth correction on one drive unit within one horizontal period (1H), and then performs signal writing in the next one horizontal period (1H). In other words, the drive circuit 20 performs Vth correction and signal writing on one drive unit in two consecutive horizontal periods (2H).

Furthermore, the drive circuit 20 performs signal writing on all pixels 11 included in groups at the same time as performing signal writing on each of the groups. To be specific, the drive circuit 20 outputs the above-described voltage V(n) to each signal line DTL when the unit write scanning line WSL(n) is selected. In other words, the drive circuit 20 outputs voltages Vsig (Vsig(n, m) and Vsig(n, m+2)) of the $n^{th}$ display pixel row to the even-numbered signal lines DTL (DTL(m) and DTL(m+2)), and at the same time, outputs voltages Vsig (Vsig(n+1, m+1) and Vsig(n+1, m+3)) of the $n+1^{th}$ display pixel row to the odd-numbered signal lines DTL (DTL(m+1) and DTL(m+3)) when the unit write scanning line WSL(n) is selected. Furthermore, the drive circuit 20 outputs voltages Vsig (Vsig(n+1, m) and Vsig(n+1, m+2)) of the $n+1^{th}$ display pixel row to the even-numbered signal lines DTL (DTL(m) and DTL(m+2)), and at the same time, outputs voltages Vsig (Vsig(n, m+1) and Vsig(n, m+3)) of the $n^{th}$ display pixel row to the odd-numbered signal lines DTL (DTL(m+1) and DTL(m+3)) when the unit write scanning line WSL(n+1) is selected.

As a result, since a period after the end of Vth correction to the start of μ correction (a so-called waiting time Δt1) coincides in each pixel 11R having the same color, the waiting time Δt1 in the plurality of pixels 11R coincides in each display pixel row. In this embodiment, a waiting time Δt2 of each pixel 11W is equal to the waiting time Δt1 of each pixel 11R. For this reason, since the waiting time Δt2 coincides even in each pixel 11W having the same color, the waiting time Δt2 of the plurality of pixels 11W coincides in each display pixel row. Furthermore, since a waiting time Δt3 coincides even in each pixel 11G having the same color, the waiting time Δt3 of the plurality of pixels 11G coincides in each display pixel row. In the present embodiment, a waiting time Δt4 of each pixel 11B is equal to the waiting time Δt3 of each pixel 11G. For this reason, since the waiting time Δt4 coincides even in each pixel 11B having the same color, the waiting time Δt4 of the plurality of pixels 11B coincides in each display pixel row. It should be noted that the waiting times Δt1 and Δt2 of the pixels 11R and 11W are different from the waiting times Δt3 and Δt4 of the pixels 11G and 11B, but the difference affects color reproducibility a little, and does not affect color irregularity.

Figure 9:
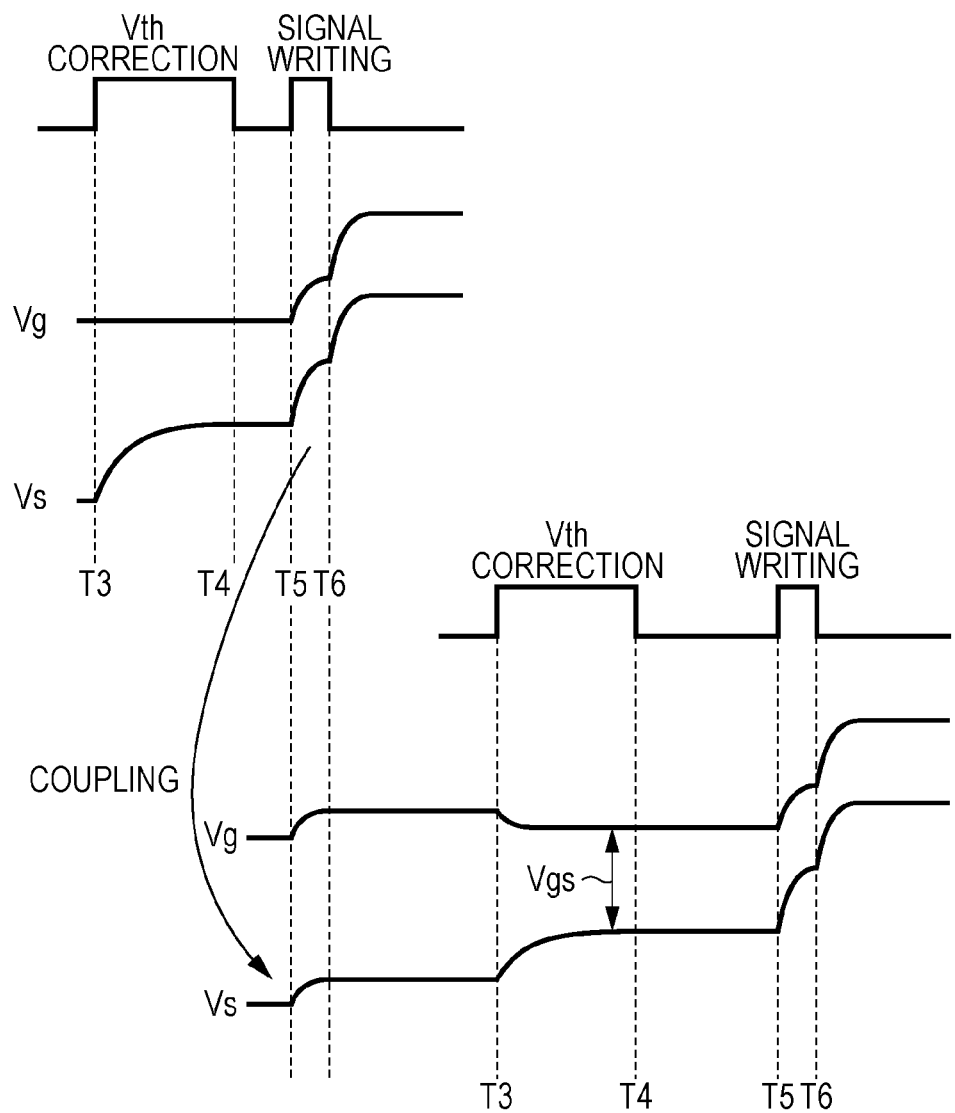
FIG. 9 is a waveform diagram for describing coupling between two pixels corresponding to two WSLs surrounded by A of FIG. 6.
Figure 10:
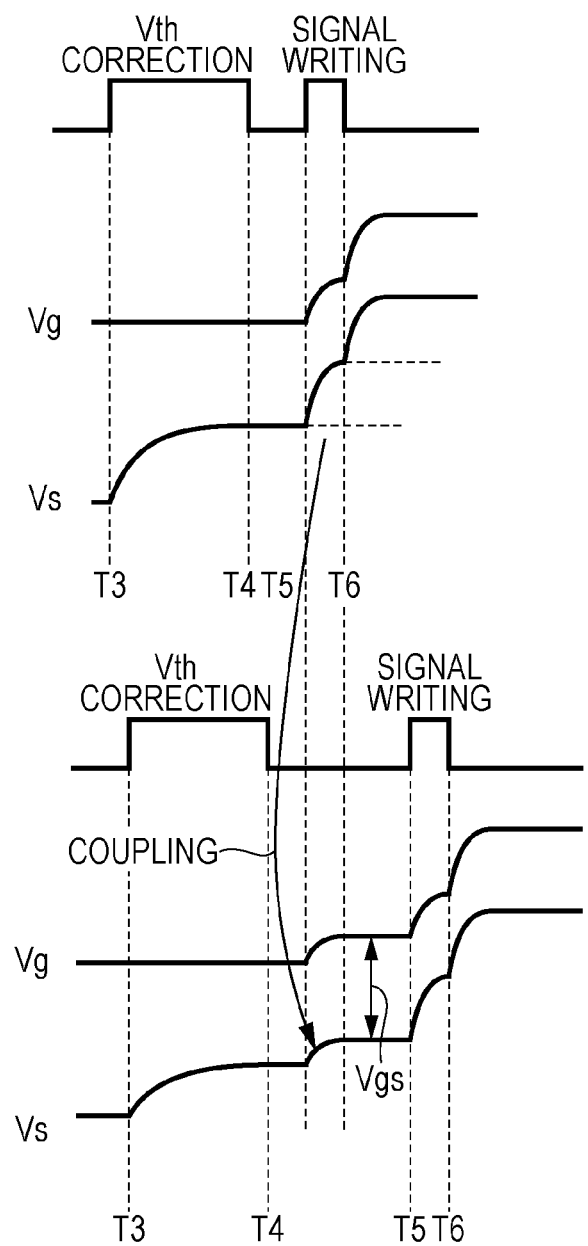
FIG. 10 is a waveform diagram for describing coupling between two pixels corresponding to 2 WSLs surrounded by B of FIG. 6.

Next, coupling in a plurality of pixels via a cathode line CTL will be described. FIG. 9 shows a state of coupling in two pixels 11 to which each waveform in A of the circle indicated by the dashed line in FIG. 6 is applied. FIG. 10 shows a state of coupling in two pixels 11 to which each waveform in B of the circle indicated by the dashed line in FIG. 6 is applied. It should be noted that, in FIG. 9, the source of coupling is the pixels 11 in the lower part of the $n+1^{th}$ display pixel row, and pixels affected by the coupling are the pixels 11 in the upper part of the $n+2^{th}$ display pixel row. In addition, in FIG. 10, the source of coupling is the pixels 11 in the lower part of the $n+2^{th}$ display pixel row, and pixels affected by the coupling are the pixels 11 in the upper part of the $n+3^{th}$ display pixel row.

The auxiliary capacitor Csub of the pixel 11 (for example, the pixel 11G) in the lower part of the $n+1^{th}$ display pixel row is connected to the auxiliary capacitor Csub of the pixel 11 (for example, the pixel 11R) in the upper part of the $n+2^{th}$ display pixel row via a cathode line CTL as shown in FIGS. 3 and 4. For this reason, when signal writing is performed in the pixel 11 in the lower part of the $n+1^{th}$ display pixel row, a change (rise) of the source voltage Vs of the drive transistor Tr1 of the pixel 11 in the lower part of the $n+1^{th}$ display pixel row is propagated to the source electrode of the drive transistor Tr1 of the pixel 11 in the upper part of the $n+2^{th}$ display pixel row via the cathode line CTL and the auxiliary capacitor Csub. As a result, the source voltage Vs changes (rises) in the drive transistor Tr1 of the pixel 11 in the upper part of the $n+2^{th}$ display pixel row, and accordingly, the gate voltage Vg also changes (rises). At this moment, the voltage Vgs between the gate sources does not significantly change before and after the change of the source voltage Vs and the gate voltage Vg. However, after such voltage changes occur, Vth correction is performed in the pixel 11 in the upper part of the n+2$^{th}$ display pixel row. At this moment, since the source voltage Vs changes (rises) according to the magnitude of the gate voltage Vg, the source voltage Vs additionally changes (rises) by the rise of the gate voltage Vg. As a result, the voltage Vgs between the gate sources after Vth correction further decreases than when there is no influence of coupling.

On the other hand, the auxiliary capacitor Csub of the pixel 11 (for example, the pixel 11G) in the lower part of the n+2$^{th}$ display pixel row is connected to the auxiliary capacitor Csub of the pixel 11 (for example, the pixel 11R) in the upper part of the n+3$^{th}$ display pixel row via a cathode line CTL as shown in FIG. 4. For this reason, when signal writing is performed in the pixel 11 in the lower part of the n+2$^{th}$ display pixel row, a change (rise) of the source voltage Vs of the drive transistor Tr1 of the pixel 11 in the lower part of the n+2$^{th}$ display pixel row is propagated to the source electrode of the drive transistor Tr1 of the pixel 11 in the upper part of the n+3$^{th}$ display pixel row via the cathode line CTL and the auxiliary capacitor Csub. As a result, the source voltage Vs changes (rises) in the drive transistor Tr1 of the pixel 11 in the upper part of the n+3$^{th}$ display pixel row, and accordingly, the gate voltage Vg also changes (rises). At this moment, the voltage Vgs between the gate sources does not significantly change before and after the change of the source voltage Vs and the gate voltage Vg. However, after such voltage changes occur, signal writing (and μ correction) is performed in the pixel 11 in the upper part of the n+3$^{th}$ display pixel row. At this moment, the gate voltage Vg has a voltage value that is greater than Vofs by a rise of the gate voltage Vg. For this reason, a signal voltage practically is reduced, and thus, the voltage Vgs between the gate sources during signal writing (and μ correction) further decreases than when there is no influence of coupling.

In this manner, in the present embodiment, the influence of signal writing on the pixel 11 in the lower part of the n+1$^{th}$ display pixel row on the pixel 11 in the upper part of the n+2$^{th}$ display pixel row is equal to the influence of signal writing on the pixel 11 in the lower part of the n+2$^{th}$ display pixel row on the pixel 11 in the upper part of the n+3$^{th}$ display pixel row. In other words, even in a circuit configuration in which coupling occurs between a plurality of pixels 11, the tendency of being affected by the coupling is the same in all pixels 11 that are affected by the coupling. Accordingly, the tendency of a change in luminance of emitted light is substantially the same in all pixels 11 that are affected by coupling.

Effect

Next, an effect of the display device 1 according to the present embodiment will be described.

Figure 11:
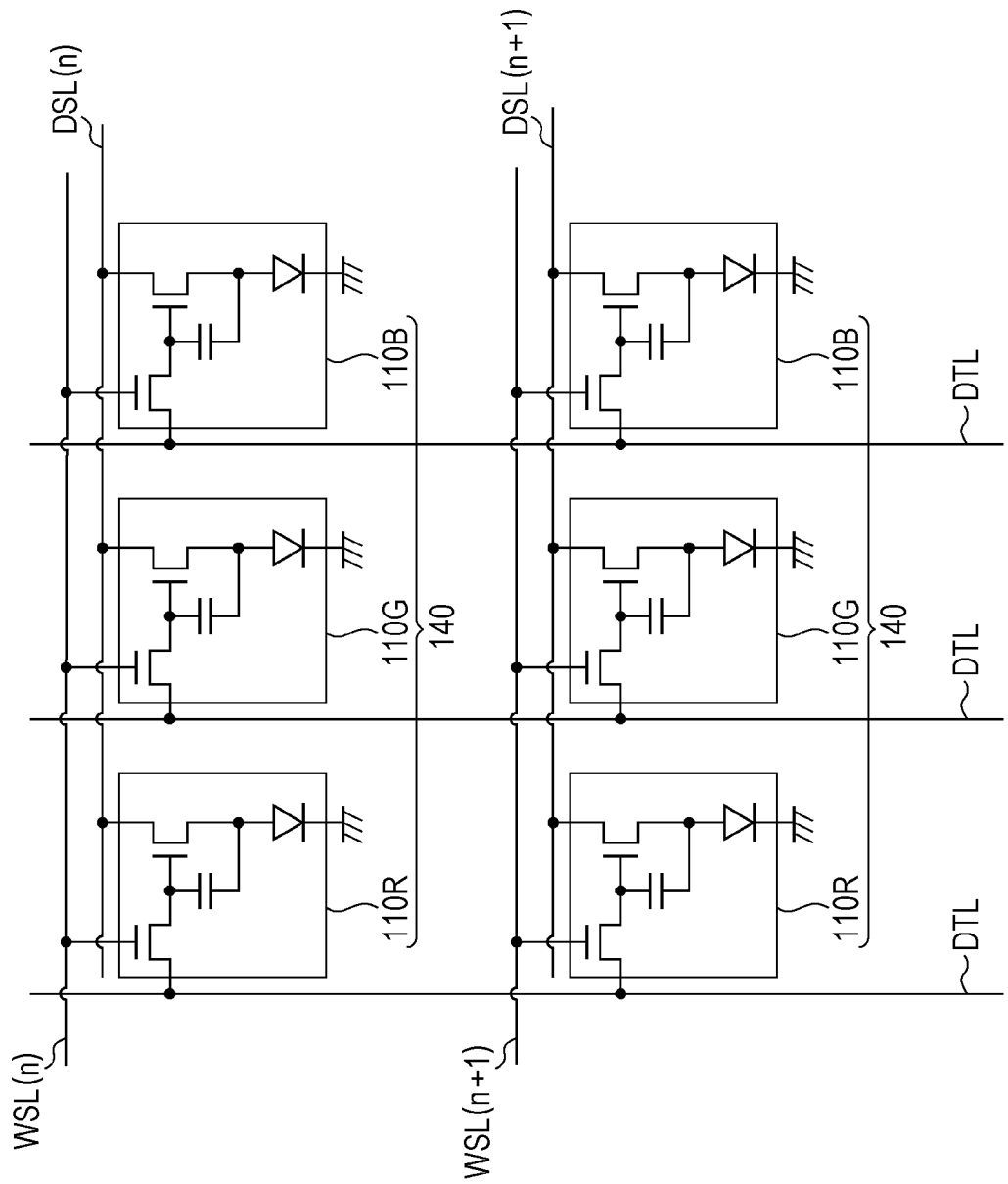
FIG. 11 is a diagram showing an example of a circuit configuration of each pixel in a display panel according to a comparative example.
Figure 12:
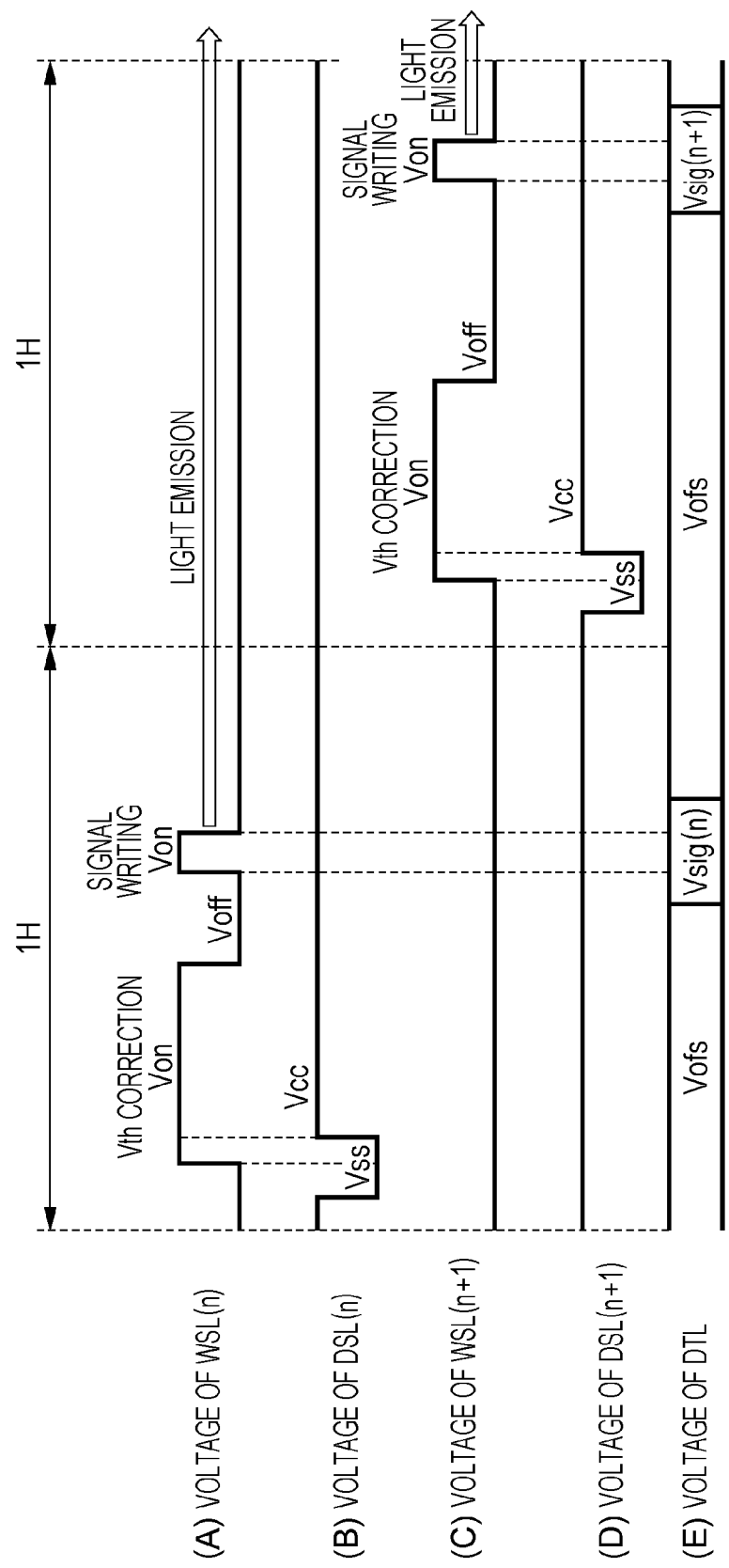
FIG. 12 is a waveform diagram showing an example of a temporal change of voltages applied to WSLs, DSLs, and a DTL when two pixels adjacent to each other in a row direction are focused in a display device that has the layout of FIG. 11.
Figure 13:
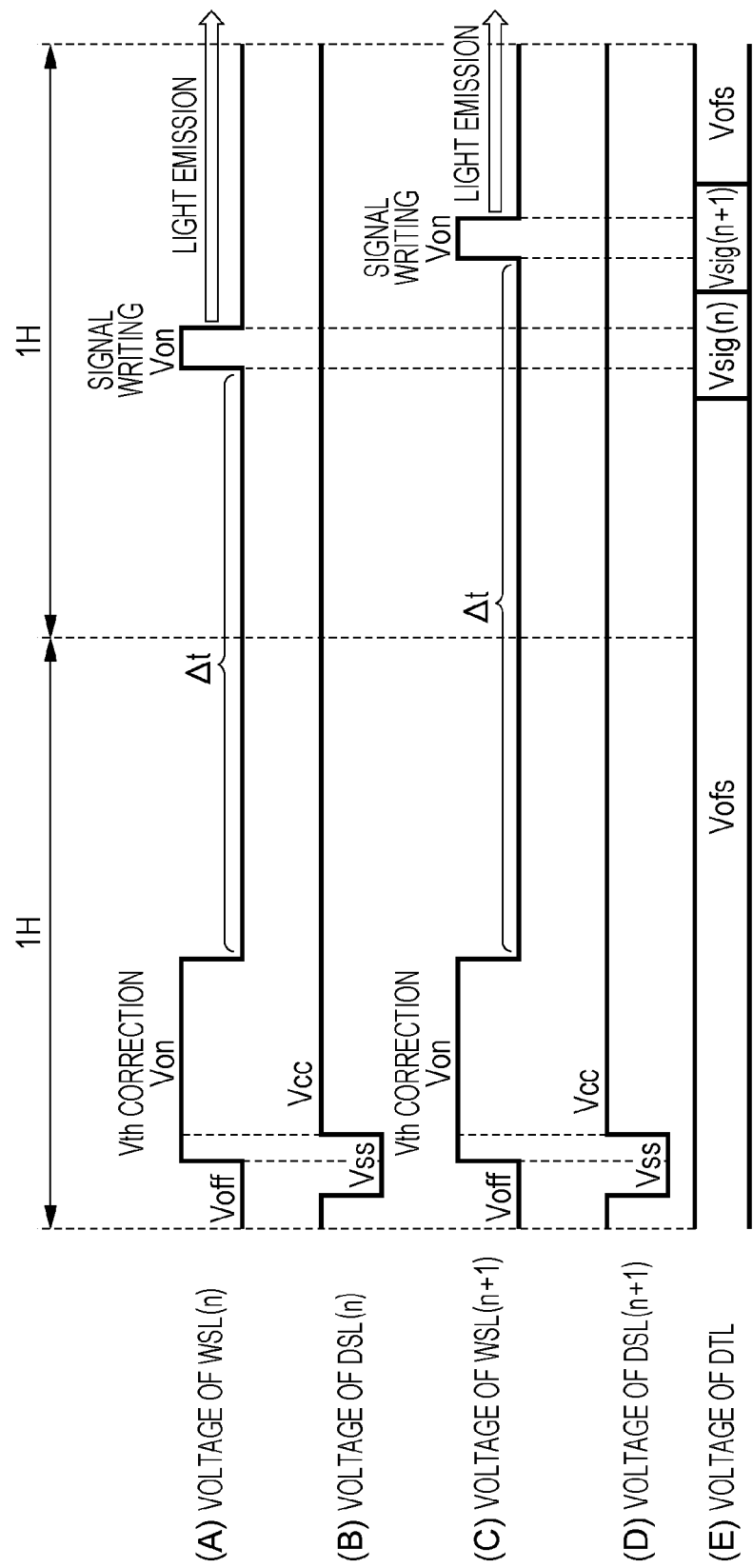
FIG. 13 is a waveform diagram showing another example of a temporal change of voltages applied to WSLs, DSLs, and a DTL when two pixels adjacent to each other in a row direction are focused in a display device that has the layout of FIG. 11.
Figure 14:
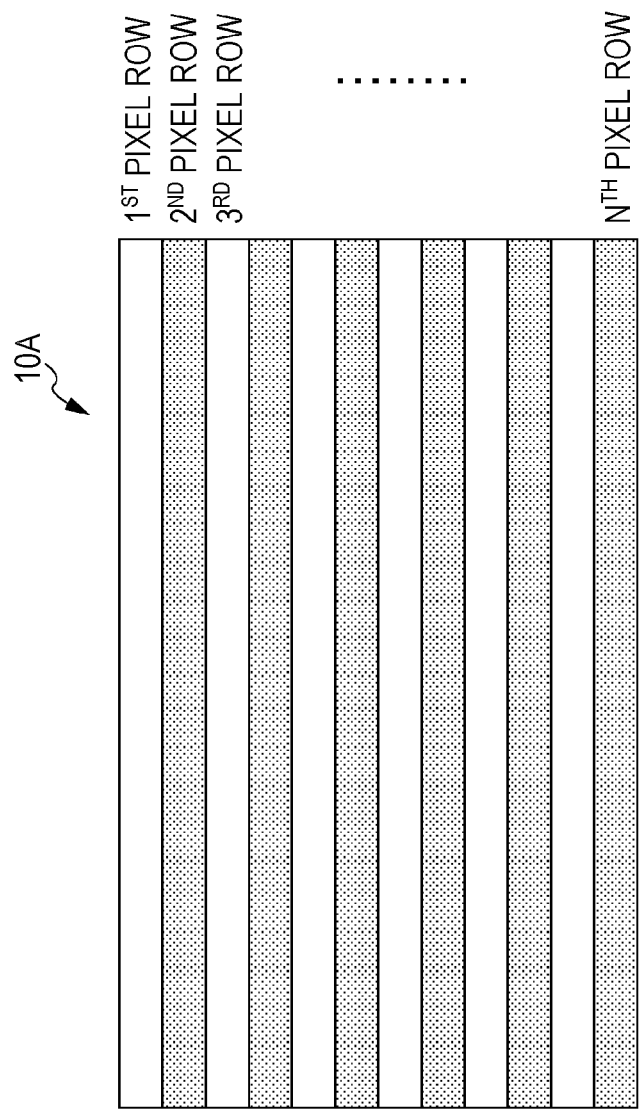
FIG. 14 is a diagram showing an example of luminance unevenness caused by a drive bundle.

FIG. 11 shows an example of pixel arrangement generally used in the related art. In the related art, each pixel 110R, 110G, and 110B included in a display pixel 140 are connected to shared scanning line WSL(n) and power source line DSL(n). In such a pixel arrangement, for example, when Vth correction and signal writing are performed for each 1H period as shown in FIG. 12, it was difficult to shorten 1H period and a scanning period per 1H (in other words, to attain high-speed driving). For this reason, for example, Vth is performed in two lines together within shared 1H period as shown in FIG. 13, and then signal writing is performed for each line in the next 1H period. This driving method is for high-speed driving in that Vth correction is performed at once. However, a waiting time Δt from the end of Vth correction to the start of signal writing is different in each line. For this reason, even when a signal voltage having the same gradation is applied to the gate of the drive transistor in each line, luminance of emitted light is different in each line as shown in FIG. 14, and there is a problem in that luminance irregularity occurs.

On the other hand, in the present embodiment each unit write scanning line WSL used in selecting each pixel 11 is connected to a plurality of pixels 11 having the same emitted light color within one drive unit. Furthermore, each unit power source line DSL used in supplying a drive current to each pixel 11 is connected to all pixels 11 of one drive unit. Accordingly, Vth correction can be performed at similar times on all groups of one drive unit, and then writing of a signal voltage can be performed on all of the groups of the drive unit for each group, as described above. As a result, since a waiting time from the end of Vth correction to the start of μ correction coincides in each pixel 11 having the same color, a waiting time in pixels 11 having the same color coincides in each line. Therefore, occurrence of luminance irregularity caused by performing Vth correction at once can be reduced.

Figure 15:
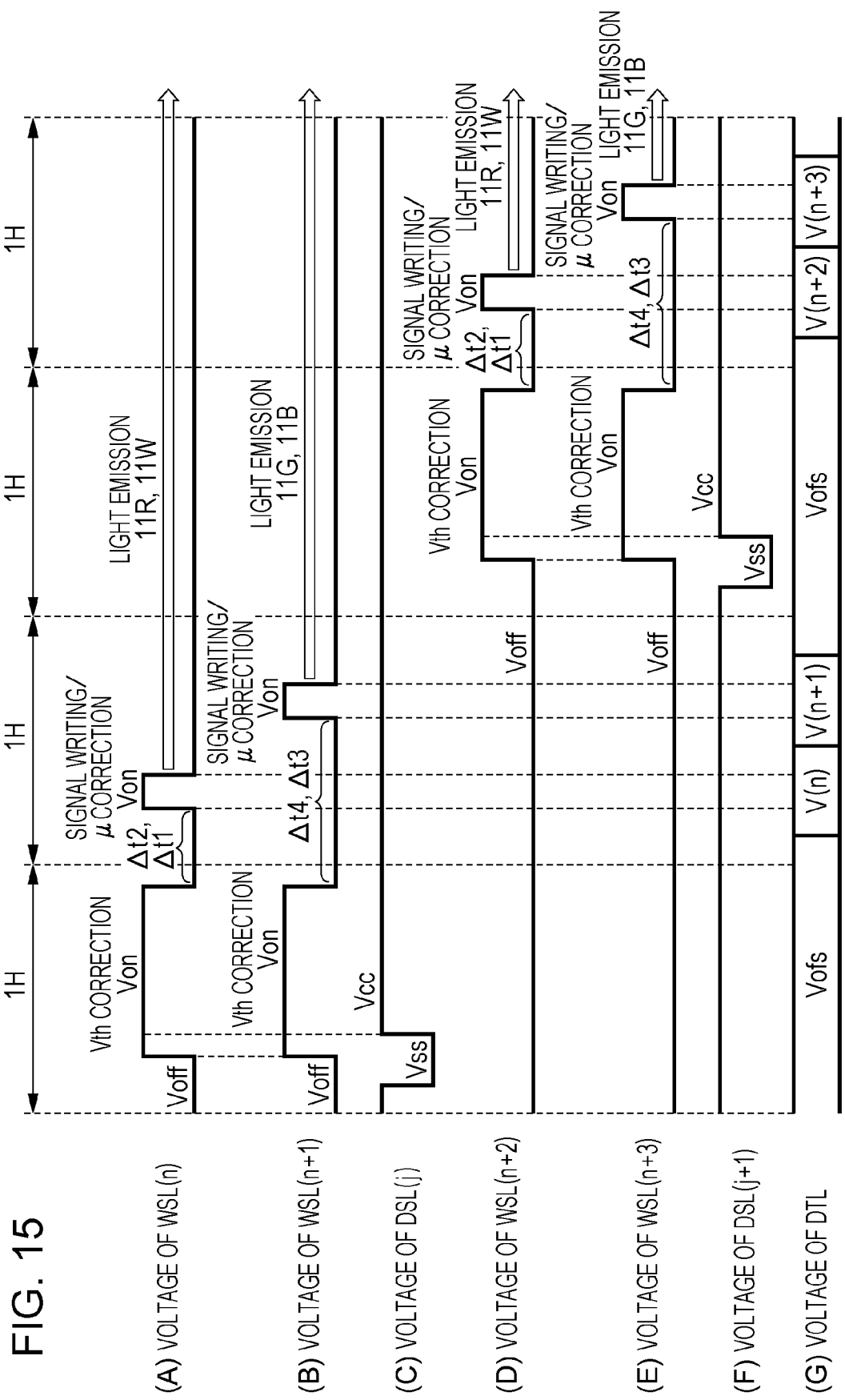
FIG. 15 is a waveform diagram showing a comparative example of a temporal change of voltages applied to WSLs, DSLs, and a DTL when two units adjacent to each other in a row direction are focused in a display device that has the layout of FIGS. 3 and 4.
Figure 16:
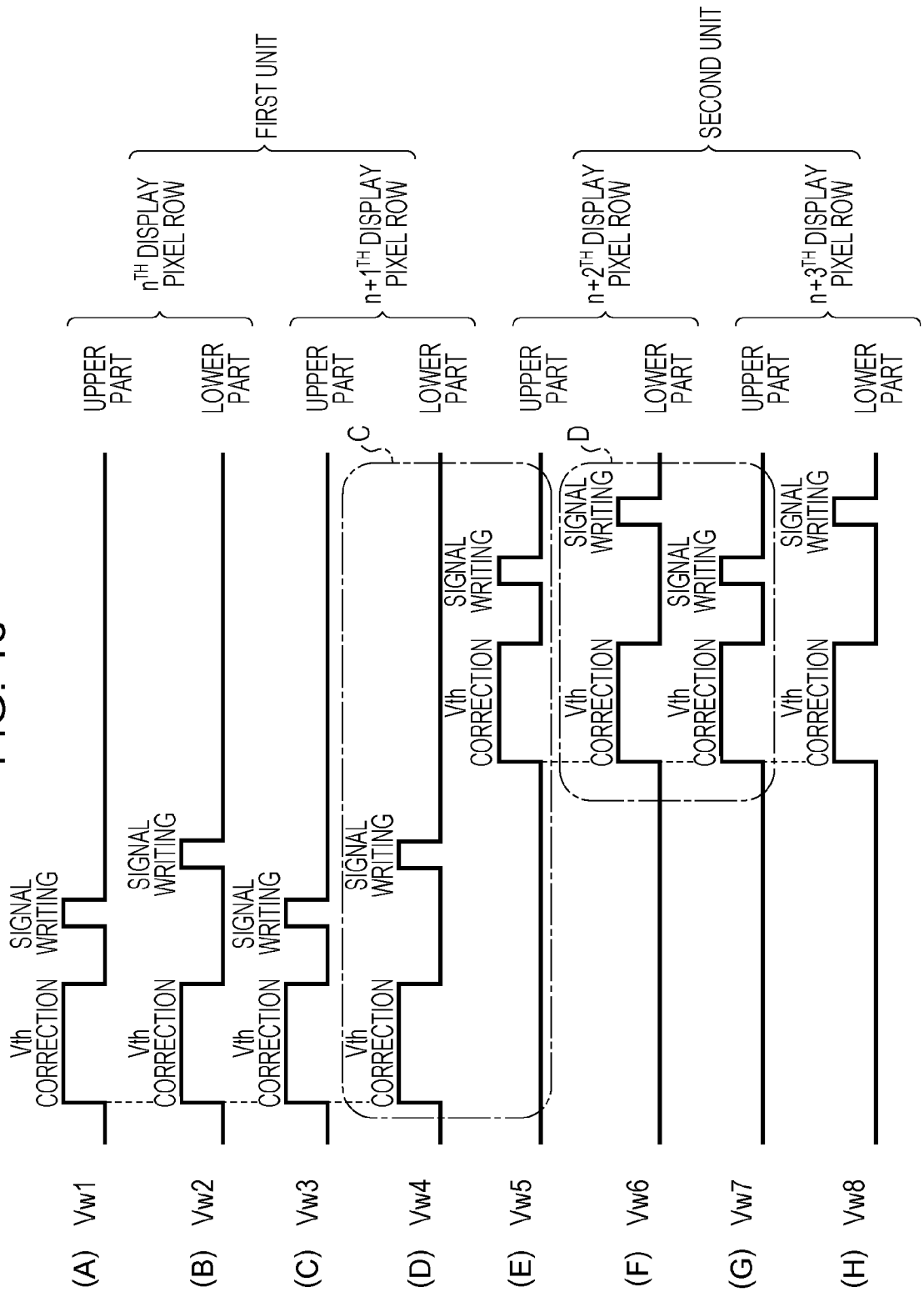
FIG. 16 is a waveform diagram showing the waveform of FIG. 15 for each branch of WSL.

FIG. 15 shows an example of scanning Vth correction and signal writing/μ correction in two drive units adjacent to each other in the column direction in a display device according to a comparative example. FIG. 16 is a waveform diagram showing an example of a temporal change of a selected pulse applied to each sub pixel row within two drive units adjacent to each other in the column direction. It should be noted that, in the display device according to the comparative example, the pixel configuration is the same as that of the embodiment above.

In present comparative example, the drive circuit 20 performs Vth correction on all groups (the first and second groups) of one drive unit at similar times, and then performs writing of a signal voltage (and μ correction) on all of the groups (the first and the second groups) of the drive unit in order of the groups in the same manner as in the embodiment above. At this moment, the scanning line drive circuit 24 is designed to sequentially select a plurality of unit write scanning lines WSL included in one drive unit in the same direction as a scanning direction when a series of operations (Vth correction and signal writing) are sequentially executed in each drive unit (hereinafter, referred to as a "drive unit scanning direction") during signal writing. As a result, since a period from the end of Vth correction to the start of μ correction (a so-called waiting time) coincides in each pixel 11 having the same color, a waiting time in each pixel 11 having the same color coincides in each display pixel row. In this point, there is no difference between the display device according to the comparative example and the display device 1 according to the embodiment above.

Figure 17:
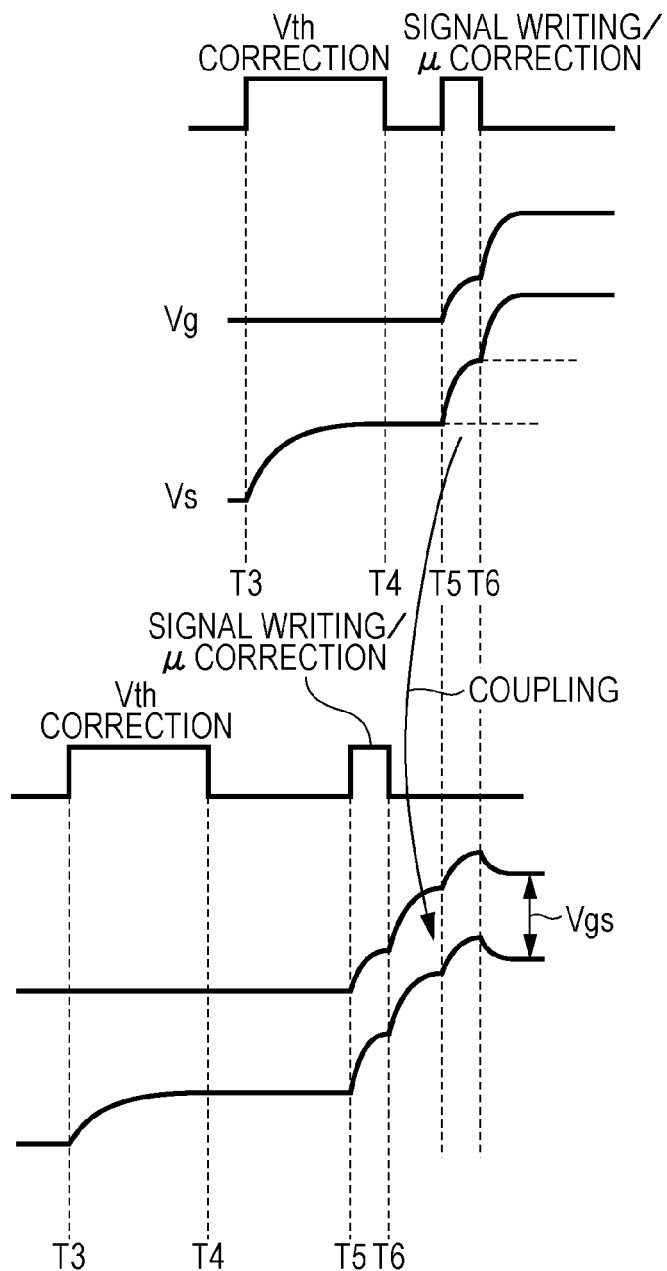
FIG. 17 is a waveform diagram for describing coupling between two pixels corresponding to two WSL surrounded by D of FIG. 16.

Next, coupling in the present comparative example will be described. FIG. 17 shows a state of coupling in two pixels 11 to which each waveform in D of the circle indicated by the dashed line in FIG. 16 is applied. It should be noted that a state of coupling in two pixels 11 to which each waveform in C of the circle indicated by the dashed line in FIG. 16 is applied is the same as that of FIG. 9.

In the present comparative example, the auxiliary capacitor Csub of the pixel 11 (for example, the pixel 11G) in the lower part of the n+2$^{th}$ display pixel row is connected to the auxiliary capacitor Csub of the pixel 11 (for example, the pixel 11R) in the upper part of the n+3$^{th}$ display pixel row via a cathode line CTL as shown in FIG. 4. For this reason, when signal writing is performed in the pixel 11 in the lower part of the n+2$^{th}$ display pixel row, a change (rise) of the source voltage Vs of the drive transistor Tr1 of the pixel 11 in the lower part of the n+2$^{th}$ display pixel row is propagated to the source electrode of the drive transistor Tr1 of the pixel 11 in the upper part of the n+3$^{th}$ display pixel row via the cathode line CTL and the auxiliary capacitor Csub. As a result, the source voltage Vs changes (rises) in the drive transistor Tr1 of the pixel 11 in the upper part of the n+3$^{th}$ display pixel row, and accordingly, the gate voltage Vg also changes (rises). At this moment, the voltage Vgs between the gate sources does not significantly change before and after the change of the source voltage Vs and the gate voltage Vg. Thus, such a voltage change in the present comparative example occurs after signal writing (and μ correction). For this reason, the voltage Vgs between the gate sources does not particularly change until the next light extinction period starts (in other words, during a light emission period).

In this manner, in the present comparative example, the influence of signal writing in the pixel 11 in the lower part of the n+1$^{th}$ display pixel row on the pixel 11 in the upper part of the n+2$^{th}$ display pixel row is different from the influence of signal writing in the pixel 11 in the lower part of the n+2$^{th}$ display pixel row on the pixel 11 in the upper part of the n+3$^{th}$ display pixel row. For this reason, luminance of emitted light in the pixel 11 in the upper part of the n+2$^{th}$ display pixel row becomes a little darker due to the lowered voltage Vgs between the gate sources. On the other hand, luminance of emitted light in the pixel 11 in the upper part of the n+3$^{th}$ display pixel row becomes lighter than that of the pixels 11 in the upper part of the n+2$^{th}$ display pixel row due to no change in the voltage Vgs between the gate sources. As a result, luminance irregularity occurs as shown in FIG. 14.

On the other hand, in the embodiment described above, the influence of signal writing in the pixel 11 in the lower part of the n+1$^{th}$ display pixel row on the pixel 11 in the upper part of the n+2$^{th}$ display pixel row is equal to the influence of signal writing in the pixel 11 in the lower part of the n+2$^{th}$ display pixel row on the pixel 11 in the upper part of the n+3$^{th}$ display pixel row as described above. In other words, even in a circuit configuration in which coupling occurs in a plurality of pixels 11, the tendency of being affected by coupling is the same in all pixels 11 affected by the coupling. Accordingly, since the tendency of a change in luminance of emitted light is substantially the same in the all pixels 11 affected by coupling, luminance irregularity can be reduced.

2. Modified Example

Hereinafter, various modified examples of the display device 1 according to the embodiment above will be described. It should be noted that, hereinbelow, the same reference numerals are give to the same constituent elements as those of the display device 1 of the embodiment above. Furthermore, description on the same constituent elements as those of the display device 1 of the embodiment above is appropriately omitted.

Modified Example 1

In the embodiment described above, a plurality of unit write scanning lines WSL are allocated by two in each drive unit, and thus the number of scanning lines WSL included in one drive unit is 2. However, although not shown in the drawings, the plurality of scanning lines WSL are allocated in each drive unit by the same number as the number of display pixel rows included in one drive unit, and the number of scanning lines WSL included in one drive unit may be the same number as that of display pixel row included in one drive unit. However, in such a case, the same voltage is applied to every two lines out of the plurality of unit write scanning lines WSL.

Modified Example 2

In the embodiment described above, the plurality of unit power source lines DSL are allocated by one in each drive unit, and thus the number of power source lines DSL included in one drive unit is 1. However, although not shown in the drawings, the plurality of power source lines DSL may be allocated in each drive unit by the same number as the number of display pixel rows included in one drive unit, and the number of power source lines DSL included in one drive unit may be the same number as that of display pixel row included in one drive unit. However, in such a case, the plurality of power source lines DSL are designed to apply the same voltage to each drive unit.

Modified Example 3

In the embodiment described above, in two display pixels 14 which are placed in different rows in one drive unit and adjacent to each other, two pixels 11 having the same emitted light color are disposed between two shared signal lines DTL. However, in two display pixels 14 which are placed in different rows in one drive unit and adjacent to each other, one pixel out of two pixels 11 having the same emitted light color may be disposed between two signal lines DTL(m) and DTL(m+1), and the other pixel may be disposed between two signal lines DTL(m+2) and DTL(m+3). For example, in two display pixels 14 which are placed in different rows in one drive unit and adjacent to each other, one pixel 11R out of two pixels 11R may be disposed between two signal lines DTL(m) and DTL(m+1), and the other pixel 11R may be disposed between two signal lines DTL(m+2) and DTL(m+3).

Modified Example 4

In the embodiment described above, the display pixel 14 is constituted by four pixels 11 having different emitted light colors from each other. Furthermore, in each display pixel 14, four pixels 11 forms a so-called cross-in-square arrangement (4 squares), and are disposed in a 2×2 matrix. However, a display pixel 14 may be constituted by six or more pixels 11 of which the number is even having different emitted light colors from each other. In this case, in each display pixel 14, the 6 or more pixels 11 of which the number is even may be disposed in a 2×a matrix. Here, a is (the number of pixels 11 in a display pixel 14)/2.

3. Application Example

Hereinafter, application examples of the display device 1 described in the embodiment above and modified examples (hereinafter, referred to as "above-described embodiment, and the like") will be described. The display device 1 according to the above-described embodiment, and the like can be applied to display devices of electronic apparatuses of all fields, such as a television device, a digital camera, a notebook-type personal computer, a mobile terminal device such as a mobile telephone, and a video camera which displays video signals input from outside or video signals generated therein as images or videos.

Application Example 1

Figure 18:
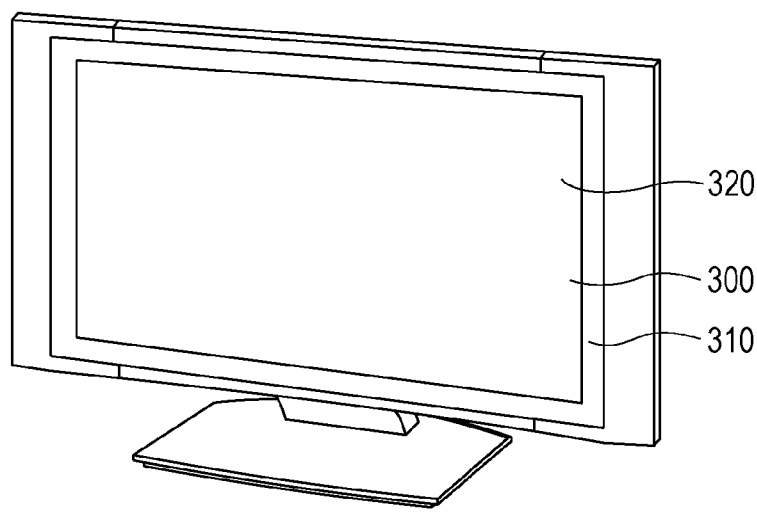
FIG. 18 is a perspective view showing the appearance of Application Example 1 of a light emitting device according to the embodiment described above.

FIG. 18 shows the appearance of a television device to which the display device 1 of the above-described embodiment, and the like is applied. This television device has a video display screen unit 300 that includes a front panel 310 and a filter glass 320, and the video display screen unit 300 is configured by the display device 1 according to the above-described embodiment, and the like.

Application Example 2

Figure 19A:
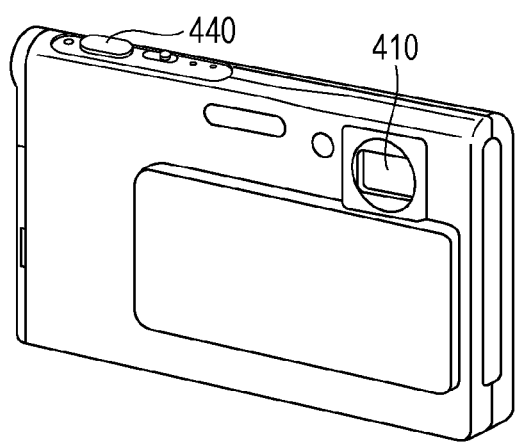
FIG. 19A is a perspective view showing the appearance of Application Example 2 as viewed from the front side.
Figure 19B:
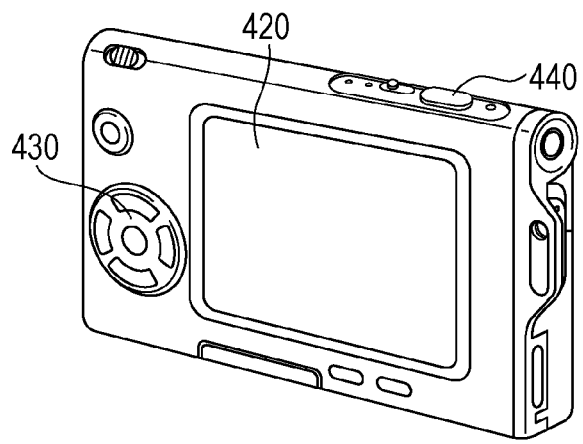
FIG. 19B is a perspective view showing the appearance of Application Example 2 as viewed from the back side.

FIGS. 19A and 19B show the appearance of a digital camera to which the display device 1 of the above-described embodiment, and the like is applied. This digital camera has, for example, a light emitting unit for flashing 410, a display unit 420, a menu switch 430, and a shutter button 440, and the display unit 420 is configured by the display device 1 according to the above-described embodiment, and the like.

Application Example 3

Figure 20:
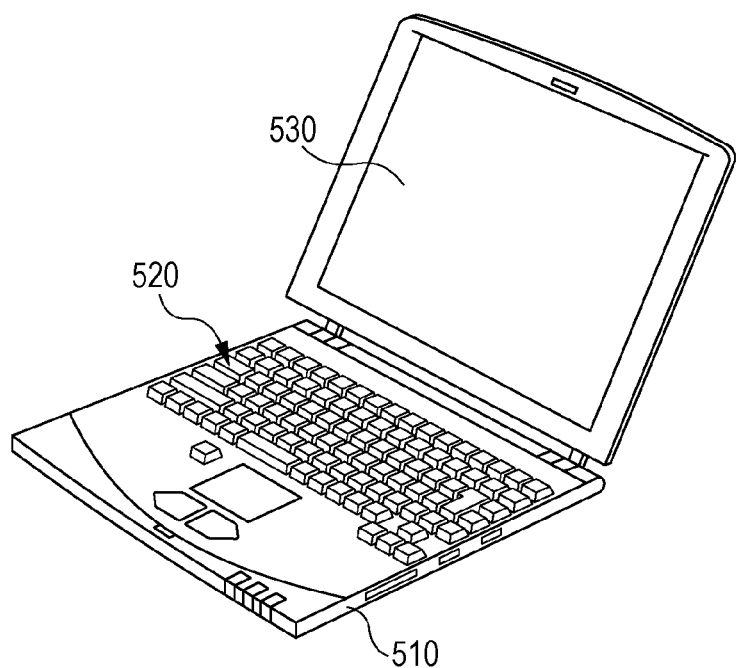
FIG. 20 is a perspective view showing the appearance of Application Example 3.

FIG. 20 shows the appearance of a notebook type personal computer to which the display device 1 of the above-described embodiment, and the like is applied. This notebook type personal computer has, for example, a main body 510, a key board 520 for operating inputs of characters, and the like, and a display unit 530 for displaying images, and the display unit 530 is configured by the display device 1 according to the above-described embodiment, and the like.

Application Example 4

Figure 21:
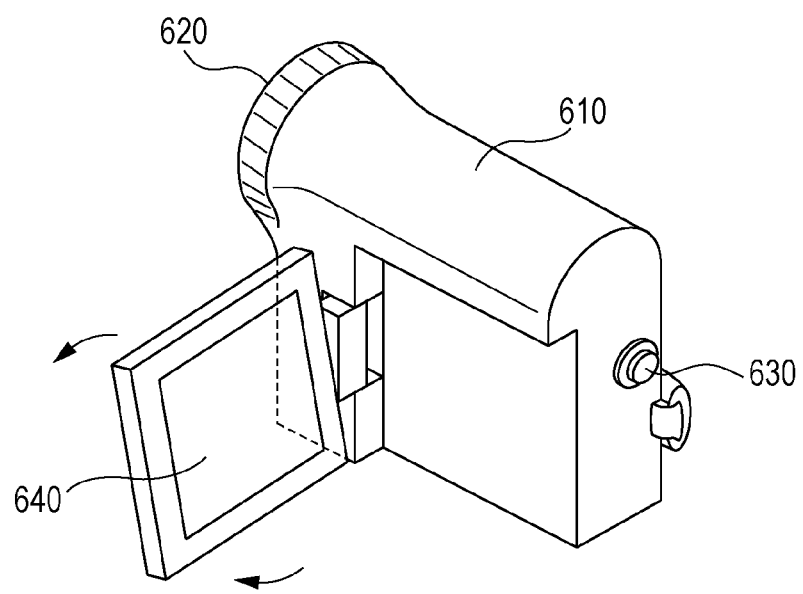
FIG. 21 is a perspective view showing the appearance of Application Example 4.

FIG. 21 shows the appearance of a video camera to which the display device 1 of the above-described embodiment, and the like is applied. This video camera has, for example, a main body unit 610, a lens 620 for photographing subjects provided on the front face of the main body unit 610, a start/stop switch 630 during photographing, and a display unit 640, and the display unit 640 is configured by the display device 1 according to the above-described embodiment, and the like.

Application Example 5

FIGS. 22A to 22G show the appearance of a mobile telephone to which the display device 1 of the above-described embodiment, and the like is applied. This mobile telephone has, for example, an upper housing 710 and a lower housing 720 which are connected in a connection portion (hinge portion) 730, a display 740, a sub display 750, a picture light 760, and a camera 770. The display 740 or sub display 750 is configured by the display device 1 according to the above-described embodiment, and the like.

Hereinabove, the present technology has been described exemplifying the embodiments and application examples, but the present technology is not limited to the above-described embodiment, and the like, and can be variously modified.

For example, in the above-described embodiment, and the like, the configuration of the pixel circuit 12 for performing active matrix drive is not limited to that described in each embodiment described above, and a capacitive element or a transistor may be added thereto, if necessary. In such a case, a necessary drive circuit other than the above described signal line drive circuit 23, scanning line drive circuit 24, and power source line drive circuit 25 may be added according to a change in the pixel circuit 12.

In addition, in the above-described embodiment, and the like, driving of the signal line drive circuit 23, scanning line drive circuit 24, and power source line drive circuit 25 is controlled by the timing generation circuit 21 and the video signal processing circuit 22, but another circuit may control driving thereof. In addition, the control of the signal line drive circuit 23, scanning line drive circuit 24, and power source line drive circuit 25 may be performed by hardware (circuit) or software (program).

In addition, in the above-described embodiment, and the like, the source and drain of the writing transistor Tr2 and the source and drain of the drive transistor Tr1 are described to be fixed, but there are of course cases in which the relationship of the source and drain facing each other is opposed to that in the above description depending on a direction in which a current flows. In such a case, the source may be read as the drain instead, and the drain may be read as the source.

In addition, in the above-described embodiment, and the like, the writing transistor Tr2 and the drive transistor Tr1 are described to be formed of n-channel MOS type TFT, but at least one of the writing transistor Tr2 and the drive transistor Tr1 may be formed of a p-channel MOS type TFT. It should be noted that, when the drive transistor Tr1 is formed of a p-channel MOS type TFT, the anode of the organic EL element 13 becomes a cathode, and the cathode of the organic EL element 13 becomes an anode in the above-described embodiment, and the like. In addition, in the above-described embodiment, and the like, the writing transistor Tr2 and the drive transistor Tr1 are not necessarily to be an amorphous silicon type TFT or a micro silicon type TFT at all times, and may be, for example, a low-temperature poly silicon type TFT, or an oxide semiconductor TFT.

In addition, for example, the present technology can have the following configurations.

(1)

A display unit comprising:

a plurality of pixel circuits disposed in a matrix form comprising rows and columns, each of the plurality of pixel circuits including a display element, a first transistor, a capacitor, and a second transistor;

a plurality of write scanning lines, each connected to a respectively corresponding row of the plurality of pixel circuits;

a plurality of signal lines, each connected to a respectively corresponding column of the plurality of pixel circuits;

a plurality of power supply lines, each connected to two respectively corresponding adjacent rows of the plurality of pixel circuits; and a drive control section, wherein the plurality of pixel circuits are grouped into drive units each comprising K≥4 contiguous rows of pixel circuits that are connected to a corresponding unit power supply line, which is made up of K/2 of the plurality of power supply lines configured as a common line, each of the drive units includes L≥2 unit write scanning lines that each comprise M≥2 of the plurality of write scanning lines configured as a common line, where K=L·M, and the drive control section is configured to cause a write scanning pulse for a signal writing operation to be sequentially applied to the unit write scanning lines of a given one of the drive units in an order that progresses in a different direction from a direction in which an order of driving the drive units to emit light progresses.

(2)

The display unit of (1), wherein each of the plurality of pixel circuits corresponds to one of N display colors and the plurality of pixel circuits are grouped into display pixel units each comprising N of the plurality of pixel circuits corresponding respectively to the N display colors, which are contiguously disposed in M≤N contiguous rows.

(3)

The display unit of (2), wherein each unit write scanning line corresponds to at least one of the display colors and is connected to all of the pixel circuits that correspond to any of the display colors to which the respective unit write scanning line corresponds and that are included in the drive unit to which the respective unit write scanning line belongs.

(4)

The display unit of (1), wherein, for each of the plurality of pixel circuits:

the first transistor is configured to sample a potential carried on one of the plurality of signal lines when a scanning pulse is applied to one of the plurality of write scanning lines, which is connected to the first transistor, the capacitor with a first terminal configured to hold the potential sampled by the first transistor, and the second transistor configured to supply a drive current to the display element, the magnitude of the drive current corresponding to a voltage between the first terminal of the capacitor and a second terminal of the capacitor.

(5)

The display unit of (1), wherein the drive units are driven unit-sequentially in an order that progresses from a first drive unit closest to a first side of the display unit to a last drive unit closest to a second side of the display unit opposite the first side, and the write scanning pulse is applied to the unit write scanning lines of the given one of the drive units sequentially in an order that progresses from a last unit write scanning line of the given one of the drive units to a first unit write scanning line of the given one of the drive units, the last unit write scanning line of the given one of the drive units including the one of the plurality of write scanning lines of the given one of the drive units that is closest to the second side of the display unit and the first unit write scanning line of the given one of the drive units including the one of the plurality of write scanning lines of the given one of the drive units that is closest to the first side of the display unit.

(6)

The display unit of (1), wherein the drive control section is configured to cause the plurality of pixel circuits to display image frames corresponding to input image data by control driving of the plurality of write scanning lines, the plurality of signal lines, and the plurality of power supply lines, the plurality of pixel circuits are configured to perform, under control of the drive control section, a threshold correction operation that results in storing a threshold voltage of the second transistor of the respective one of the plurality of pixel circuit in the capacitor of the respective one of the plurality of pixel circuit, and the drive control section is configured to cause each of the plurality of pixel circuits included in the given one of the drive units to perform the threshold correction operation simultaneously during a given image frame period.

(7)

The display unit of (6), wherein the drive control section is configured to cause each of the plurality of pixel circuits included in the given one of the drive units to perform the threshold correction operation by causing the first transistor of the respective pixel circuit to be in a conductive state while a reference potential is carried on the signal line connected to the respective pixel circuit and while a drive voltage is applied to the second transistor of the respective pixel circuit.

(8)

The display unit of (1), wherein, for a given one of the plurality of pixel circuits, the signal writing operation comprises causing the given one of the plurality of pixel circuits to sample a video signal potential by placing the first transistor of the given one of the plurality of pixel circuits in a conductive state while a video signal potential is applied to the signal line connected to the given one of the plurality of pixel circuits.

(9)

The display unit of (2), wherein N=4, M=2, K=4, and the display colors comprise red, green, and blue.

(10)

The display unit of (9), wherein the display colors further comprise white.

(11)

The display unit of (9), wherein the display colors further comprise yellow.

(12)

A display unit comprising:

a plurality of pixel circuits disposed in a matrix form comprising rows and columns, each of the plurality of pixel circuits including a display element, a first transistor, a capacitor, and a second transistor;

a plurality of write scanning lines, each connected to a respectively corresponding row of the plurality of pixel circuits;

a plurality of signal lines, each connected to a respectively corresponding column of the plurality of pixel circuits;

a plurality of power supply lines, each connected to two respectively corresponding adjacent rows of the plurality of pixel circuits; and a drive control section, wherein the plurality of pixel circuits are grouped into drive units each comprising four contiguous rows of pixel circuits that are connected to a corresponding unit power supply line, which is made up of two of the plurality of power supply lines configured as a common line, each of the drive units includes two unit write scanning lines that each comprise two of the plurality of write scanning lines configured as a common line, and the drive control section is configured to cause a write scanning pulse for a signal writing operation to be sequentially applied to the unit write scanning lines of a given one of the drive units in an order that progresses in a different direction from a direction in which an order of driving the drive units to emit light progresses.

(13)

The display unit of (12), wherein each of the plurality of pixel circuits corresponds to one of four display colors and the plurality of pixel circuits are grouped into display pixel units each comprising four of the plurality of pixel circuits contiguously disposed in two adjacent rows and corresponding respectively to the four display colors.

(14)

The display unit of (13), wherein each unit write scanning line corresponds to two of the display colors and is connected to all of the pixel circuits that correspond to any of the display colors to which the respective unit write scanning line corresponds and that are included in the drive unit to which the respective unit write scanning line belongs.

(15)

The display unit of (14), wherein, for each of the plurality of pixel circuits:

the first transistor is configured to sample a potential carried on one of the plurality of signal lines when a scanning pulse is applied to one of the plurality of write scanning lines, which is connected to the first transistor, the capacitor with a first terminal is configured to hold the potential sampled by the first transistor, and the second transistor is configured to supply a drive current to the display element, the magnitude of the drive current corresponding to a voltage between the first terminal of the capacitor and a second terminal of the capacitor.

(16)

The display unit of (12), wherein the drive units are driven unit-sequentially in an order that progresses from a first drive unit closest to a first side of the display unit to a last drive unit closest to a second side of the display unit opposite the first side, and the write scanning pulse is applied to the unit write scanning lines of the given one of the drive units sequentially in an order that progresses from a last unit write scanning line of the given one of the drive units to a first unit write scanning line of the given one of the drive units, the last unit write scanning line of the given one of the drive units including the one of the plurality of write scanning lines of the given one of the drive units that is closest to the second side of the display unit and the first unit write scanning line of the given one of the drive units including the one of the plurality of write scanning lines of the given one of the drive units that is closest to the first side of the display unit.

(17)

The display unit of (12), wherein the drive control section is configured to cause the plurality of pixel circuits to display image frames corresponding to input image data by control driving of the plurality of write scanning lines, the plurality of signal lines, and the plurality of power supply lines, the plurality of pixel circuits are configured to perform, under control of the drive control section, a threshold correction operation that results in storing a threshold voltage of the second transistor of the respective one of the plurality of pixel circuit in the capacitor of the respective one of the plurality of pixel circuit, and the drive control section is configured to cause each of the plurality of pixel circuits included in the given one of the drive units to perform the threshold correction operation simultaneously during a given image frame period.

(18)

The display unit of (17), wherein the drive control section is configured to cause each of the plurality of pixel circuits included in the given one of the drive units to perform the threshold correction operation by causing the first transistor of the respective pixel circuit to be in a conductive state while a reference potential is carried on the signal line connected to the respective pixel circuit and while a drive voltage is applied to the second transistor of the respective pixel circuit.

(19)

The display unit of (12), wherein, for a given one of the plurality of pixel circuits, the signal writing operation comprises causing the given one of the plurality of pixel circuits to sample a video signal potential by placing the first transistor of the given one of the plurality of pixel circuits in a conductive state while a video signal potential is applied to the signal line connected to the given one of the plurality of pixel circuits.

(20)

A method of driving a display unit comprising:

causing drive units to sequentially emit light in an order that progresses in a given direction; and causing a write scanning pulse for a signal writing operation to be sequentially applied to unit write scanning lines of a given one of the drive units in an order that progresses in a direction different from the given direction, wherein the display unit comprises: a plurality of pixel circuits disposed in a matrix form comprising rows and columns and each including a display element, a first transistor, a capacitor, and a second transistor; a plurality of write scanning lines, each connected to a respectively corresponding row of the plurality of pixel circuits; a plurality of signal lines, each connected to a respectively corresponding column of the plurality of pixel circuits; and a plurality of power supply lines, each connected to two respectively corresponding adjacent rows of the plurality of pixel circuits, the drive units each comprise K≥4 contiguous rows of pixel circuits that are connected to a same unit power supply line, which is made up of K/2 of the plurality of power supply lines configured as a common line, and each of the drive units includes L≥2 unit write scanning lines that each comprise M≥2 of the plurality of write scanning lines configured as a common line, where K=L·M.

(21)

A display device comprising:

a display panel; and a drive circuit that drives the display panel, wherein the display panel has a plurality of pixels including a plurality of sub pixels;

wherein each of the sub pixels includes a light emitting element, a drive transistor that drives the light emitting element, a writing transistor that writes a signal voltage corresponding to a video signal, and a holding capacitor that holds a voltage between gate sources of the drive transistor, wherein, when k (k≥2) pixel rows form one unit, the drive circuit executes Vth correction in which the voltage between the gate sources of the drive transistor is brought in proximity to a threshold voltage of the drive transistor and writing of the signal voltage in a first unit, and then executes the Vth correction and the writing of the signal voltage in a second unit that is adjacent to the first unit in a column direction, and wherein the drive circuit executes writing of the signal voltage in each sub pixel of one pixel row by scanning in a direction opposite to a scanning direction when writing of the signal voltage is performed in each unit.

(22)

The display device of (21), wherein a plurality of sub pixels included in each pixel are disposed in a 2×y (y≥2) matrix, and wherein the drive circuit executes writing of the signal voltage in each sub pixel of one pixel row on a sub pixel in the lower part of the pixel row, and then executes the writing on a sub pixel in the upper part thereof.

(23)

The display device of (22), wherein the display panel has a plurality of first wirings allocated by one to a sub pixel row in the upper part of each pixel row of one unit and a plurality of a second wirings allocated by one to a sub pixel row in the lower part of each sub pixel row of one unit, wherein emitted light colors of the sub pixels are different from each other in each pixel, wherein each first wiring is connected to a plurality of sub pixels having the same emitted light color within one unit, wherein each second wiring is connected to a plurality of sub pixels having emitted light colors different from those of the sub pixels connected to the first wiring but having the same emitted light color within one unit, and wherein the drive circuit executes writing of the signal voltage in each sub pixel of one pixel row on each sub pixel connected to the second wiring, and then executes the writing on each sub pixel connected to the first wiring.

(24)

The display device of (23), wherein each sub pixel further includes an auxiliary capacitor connected to a source of the drive transistor, and wherein the display panel further has a plurality of reference voltage lines which are allocated by one to every two sub pixel rows which are adjacent to each other in the column direction but placed in different pixel rows, and connected to the auxiliary capacitor.

(25)

The display device of (24), wherein each reference voltage line is connected to all auxiliary capacitors included in two allocated sub pixel rows.

(26)

An electronic apparatus comprising:

a display device, wherein the display device has a display panel, and a drive circuit that drives the display panel, wherein the display panel has a plurality of pixels including a plurality of sub pixels, wherein each of the sub pixels includes a light emitting element, a drive transistor that drives the light emitting element, a writing transistor that writes a signal voltage corresponding to a video signal, and a holding capacitor that holds a voltage between gate sources of the drive transistor, wherein, when k (k≥2) pixel rows form one unit, the drive circuit executes Vth correction in which the voltage between the gate sources of the drive transistor is brought in proximity to a threshold voltage of the drive transistor and writing of the signal voltage in a first unit, and then executes the Vth correction and the writing of the signal voltage in a second unit that is adjacent to the first unit in a column direction, and wherein the drive circuit executes writing of the signal voltage in each sub pixel of one pixel row by scanning in a direction opposite to a scanning direction when writing of the signal voltage is performed in each unit.

(27)

A driving method of a display panel which includes a plurality of pixels including a plurality of sub pixels, and each of the sub pixels has a light emitting element, a drive transistor that drives the light emitting element, a writing transistor that writes a signal voltage corresponding to a video signal, and a holding capacitor that holds a voltage between gate sources of the drive transistor, the method comprising:

executing Vth correction in which the voltage between the gate sources of the drive transistor is brought in proximity to a threshold voltage of the drive transistor and writing of the signal voltage in a first unit, and then executing the Vth correction and the writing of the signal voltage in a second unit that is adjacent to the first unit in a column direction when k (k≥2) pixel rows form one unit; and executing writing of the signal voltage in each sub pixel of one pixel row by scanning in a direction opposite to a scanning direction when writing of the signal voltage is performed in each unit.

The present disclosure contains subject matter related to that disclosed in Japanese Priority Patent Application JP 2012-170306 filed in the Japan Patent Office on Jul. 31, 2012, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A display unit comprising:

a plurality of pixel circuits disposed in a matrix form comprising rows and columns, each of the plurality of pixel circuits including a display element, a first transistor, a capacitor, and a second transistor;

a plurality of write scanning lines, each corresponding to one of the rows and being connected to each of the plurality of pixel circuits that is disposed in the corresponding row;

a plurality of signal lines, each corresponding to one of the columns and being connected to each of the plurality of pixel circuits that is disposed in the corresponding column;

a plurality of power supply lines, each corresponding to two of the rows that are adjacent to each other and being connected to each of the plurality of pixel circuits that is disposed in the corresponding two rows; and a drive control section, wherein the plurality of power supply lines are grouped into unit power supply lines each comprising K/2 of the plurality of power supply lines collectively configured as a common line, where K≥4, the plurality of write scanning lines are grouped into unit write scanning lines each comprising M≥2 of the plurality of write scanning lines collectively configured as a common line with a nonadjacent row but not with an adjacent row, the plurality of pixel circuits are grouped into drive units that each include K contiguous rows that correspond to one of the unit power supply lines and to L≥2 of the unit write scanning lines, where K=L·M, and the drive control section is configured to cause the drive units to sequentially begin light emission in an order progressing in a first direction and to cause a write scanning pulse for a signal writing operation to be sequentially applied to the unit write scanning lines of a given one of the drive units in an order that progresses in a second different direction from the first direction.

2. The display unit of claim 1, wherein each of the plurality of pixel circuits corresponds to one of N display colors and the plurality of pixel circuits are grouped into display pixel units each comprising N of the plurality of pixel circuits corresponding respectively to the N display colors, which are contiguously disposed in M≤N contiguous rows.

3. The display unit of claim 2, wherein each unit write scanning line corresponds to at least one of the display colors and is connected to all of the pixel circuits that correspond to any of the display colors to which the respective unit write scanning line corresponds and that are included in the drive unit to which the respective unit write scanning line belongs.

4. The display unit of claim 2, wherein N=4, M=2, K=4, and the display colors comprise red, green, and blue.

5. The display unit of claim 4, wherein the display colors further comprise white.

6. The display unit of claim 4, wherein the display colors further comprise yellow.

7. The display unit of claim 1, wherein, for each of the plurality of pixel circuits:

the first transistor is configured to sample a potential carried on one of the plurality of signal lines when a scanning pulse is applied to one of the plurality of write scanning lines, which is connected to the first transistor, the capacitor with a first terminal is configured to hold the potential sampled by the first transistor, and the second transistor is configured to supply a drive current to the display element, the magnitude of the drive current corresponding to a voltage between the first terminal of the capacitor and a second terminal of the capacitor.

8. The display unit of claim 1,
wherein the drive units are driven unit-sequentially in an order that progresses from a first drive unit closest to a first side of the display unit to a last drive unit closest to a second side of the display unit opposite the first side, and the write scanning pulse is applied to the unit write scanning lines of the given one of the drive units sequentially in an order that progresses from a last unit write scanning line of the given one of the drive units to a first unit write scanning line of the given one of the drive units, the last unit write scanning line of the given one of the drive units including the one of the plurality of write scanning lines of the given one of the drive units that is closest to the second side of the display unit and the first unit write scanning line of the given one of the drive units including the one of the plurality of write scanning lines of the given one of the drive units that is closest to the first side of the display unit.

9. The display unit of claim 1,
wherein the drive control section is configured to cause the plurality of pixel circuits to display image frames corresponding to input image data by control driving of the plurality of write scanning lines, the plurality of signal lines, and the plurality of power supply lines, the plurality of pixel circuits are configured to perform, under control of the drive control section, a threshold correction operation that results in storing a threshold voltage of the second transistor of the respective one of the plurality of pixel circuit in the capacitor of the respective one of the plurality of pixel circuit, and the drive control section is configured to cause each of the plurality of pixel circuits included in the given one of the drive units to perform the threshold correction operation simultaneously during a given image frame period.

10. The display unit of claim 9,
wherein the drive control section is configured to cause each of the plurality of pixel circuits included in the given one of the drive units to perform the threshold correction operation by causing the first transistor of the respective pixel circuit to be in a conductive state while a reference potential is carried on the signal line connected to the respective pixel circuit and while a drive voltage is applied to the second transistor of the respective pixel circuit.

11. The display unit of claim 1,
wherein, for a given one of the plurality of pixel circuits, the signal writing operation comprises causing the given one of the plurality of pixel circuits to sample a video signal potential by placing the first transistor of the given one of the plurality of pixel circuits in a conductive state while a video signal potential is applied to the signal line connected to the given one of the plurality of pixel circuits.

12. A display unit comprising:
a plurality of pixel circuits disposed in a matrix form comprising rows and columns, each of the plurality of pixel circuits including a display element, a first transistor, a capacitor, and a second transistor;

a plurality of write scanning lines, each corresponding to one of the rows and being connected to each of the plurality of pixel circuits that is disposed in the corresponding row;

a plurality of signal lines, each corresponding to one of the columns and being connected to each of the plurality of pixel circuits that is disposed in the corresponding column;

a plurality of power supply lines, each corresponding to two the rows that are adjacent to each other and being connected to each of the plurality of pixel circuits that is disposed in the corresponding two rows; and a drive control section,
wherein the plurality of power supply lines are grouped into unit power supply lines each comprising two of the plurality of power supply lines collectively configured as a common line, the plurality of write scanning lines are grouped into unit write scanning lines each comprising two of the plurality of write scanning lines collectively configured as a common line with a nonadjacent row but not with an adjacent row, the plurality of pixel circuits are grouped into drive units that each include four contiguous rows of pixel circuits that correspond to one of the unit power supply lines and to two of the unit write scanning lines, and the drive control section is configured to cause the drive units to sequentially begin light emission in an order progressing in a first direction and to cause a write scanning pulse for a signal writing operation to be sequentially applied to the unit write scanning lines of a given one of the drive units in an order that progresses in a second different direction from the first direction.

13. The display unit of claim 12,
wherein each of the plurality of pixel circuits corresponds to one of four display colors and the plurality of pixel circuits are grouped into display pixel units each comprising four of the plurality of pixel circuits contiguously disposed in two adjacent rows and corresponding respectively to the four display colors.

14. The display unit of claim 13,
wherein each unit write scanning line corresponds to two of the display colors and is connected to all of the pixel circuits that correspond to any of the display colors to which the respective unit write scanning line corresponds and that are included in the drive unit to which the respective unit write scanning line belongs.

15. The display unit of claim 14,
wherein, for each of the plurality of pixel circuits:
the first transistor is configured to sample a potential carried on one of the plurality of signal lines when a scanning pulse is applied to one of the plurality of write scanning lines, which is connected to the first transistor, the capacitor with a first terminal is configured to hold the potential sampled by the first transistor, and the second transistor is configured to supply a drive current to the display element, the magnitude of the drive current corresponding to a voltage between the first terminal of the capacitor and a second terminal of the capacitor.

16. The display unit of claim 12,
wherein the drive units are driven unit-sequentially in an order that progresses from a first drive unit closest to a first side of the display unit to a last drive unit closest to a second side of the display unit opposite the first side, and the write scanning pulse is applied to the unit write scanning lines of the given one of the drive units sequentially in an order that progresses from a last unit write scanning line of the given one of the drive units to a first unit write scanning line of the given one of the drive units, the last unit write scanning line of the given one of the drive units including the one of the plurality of write scanning lines of the given one of the drive units that is closest to the second side of the display unit and the first unit write scanning line of the given one of the drive units including the one of the plurality of write scanning lines of the given one of the drive units that is closest to the first side of the display unit.

17. The display unit of claim 12,
wherein the drive control section is configured to cause the plurality of pixel circuits to display image frames corresponding to input image data by control driving of the plurality of write scanning lines, the plurality of signal lines, and the plurality of power supply lines, the plurality of pixel circuits are configured to perform, under control of the drive control section, a threshold correction operation that results in storing a threshold voltage of the second transistor of the respective one of the plurality of pixel circuit in the capacitor of the respective one of the plurality of pixel circuit, and the drive control section is configured to cause each of the plurality of pixel circuits included in the given one of the drive units to perform the threshold correction operation simultaneously during a given image frame period.

18. The display unit of claim 17,
wherein the drive control section is configured to cause each of the plurality of pixel circuits included in the given one of the drive units to perform the threshold correction operation by causing the first transistor of the respective pixel circuit to be in a conductive state while a reference potential is carried on the signal line connected to the respective pixel circuit and while a drive voltage is applied to the second transistor of the respective pixel circuit.

19. The display unit of claim 12,
wherein, for a given one of the plurality of pixel circuits, the signal writing operation comprises causing the given one of the plurality of pixel circuits to sample a video signal potential by placing the first transistor of the given one of the plurality of pixel circuits in a conductive state while a video signal potential is applied to the signal line connected to the given one of the plurality of pixel circuits.

20. A method of driving a display unit comprising:
causing drive units to sequentially emit light in an order that progresses in a first direction; and
causing a write scanning pulse for a signal writing operation to be sequentially applied to unit write scanning lines of a given one of the drive units in an order that progresses in a second direction different from the first direction,
wherein the display unit comprises: a plurality of pixel circuits disposed in a matrix form comprising rows and columns and each including a display element, a first transistor, a capacitor, and a second transistor; a plurality of write scanning lines, each corresponding to one of the rows and being connected to each of the plurality of pixel circuits that is disposed in the corresponding row; a plurality of signal lines, each corresponding to one of the columns and being connected to each of the plurality of pixel circuits that is disposed in the corresponding column; and a plurality of power supply lines, each corresponding to two of the rows that are adjacent to each other and being connected to each of the plurality of pixel circuits that is disposed in the corresponding two adjacent rows,
the drive units each comprise $K \geq 4$ contiguous rows of pixel circuits that are connected to a same unit power supply line, which is made up of K/2 of the plurality of power supply lines configured collectively as a common line, and
each of the drive units includes $L \geq 2$ unit write scanning lines that each comprise $M \geq 2$ of the plurality of write scanning lines configured as a common line with a nonadjacent row but not with an adjacent row, where $K = L \cdot M$.

* * * * *